(12) United States Patent
Nishi

(10) Patent No.: US 6,891,603 B2
(45) Date of Patent: May 10, 2005

(54) MANUFACTURING METHOD IN MANUFACTURING LINE, MANUFACTURING METHOD FOR EXPOSURE APPARATUS, AND EXPOSURE APPARATUS

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 71 days.

(21) Appl. No.: 10/026,909

(22) Filed: Dec. 27, 2001

(65) Prior Publication Data

US 2002/0085190 A1 Jul. 4, 2002

(30) Foreign Application Priority Data

Dec. 28, 2000 (JP) ..................................... 2000-400622
Dec. 26, 2001 (JP) ..................................... 2001-395489

(51) Int. Cl.[7] ........................ G03B 27/32; G03B 27/42
(52) U.S. Cl. ......................................... 355/77; 355/53
(58) Field of Search ...................... 355/53, 67, 72–77; 700/121, 185; 438/15

(56) References Cited

U.S. PATENT DOCUMENTS

| | | | |
|---|---|---|---|
| 5,826,129 A | 10/1998 | Hasebe et al. | ............... 396/611 |
| 5,898,480 A | 4/1999 | Ozawa | ......................... 355/67 |
| 5,907,392 A | 5/1999 | Makinouchi | .................. 355/53 |
| 5,986,743 A | 11/1999 | Hanzawa | |
| 6,027,262 A | 2/2000 | Akimoto | ..................... 396/611 |
| 6,262,796 B1 | 7/2001 | Loopstra et al. | .............. 355/53 |
| 6,327,022 B1 | 12/2001 | Nishi | .......................... 355/53 |

FOREIGN PATENT DOCUMENTS

| | | |
|---|---|---|
| EP | 0 834 772 A2 | 4/1998 |
| EP | 0 951 054 A1 | 10/1999 |
| EP | 1 030 351 A1 | 8/2000 |
| JP | 10-335207 | 12/1998 |

*Primary Examiner*—Henry Hung Nguyen
(74) *Attorney, Agent, or Firm*—Oliff & Berridge, PLC

(57) ABSTRACT

A manufacturing method for exposure apparatuses is provided in which a reticle R1 held on a reticle stage system (RST) is illuminated by exposure light from an exposure light source (16) via the illumination systems (IL1) and (IL2). In a first manufacturing line, a main body module composed of a frame caster (2), a main body support section 3), and a main body column (5) is assembled, and an illumination system and the projection optical system PL are mounted on this main body module. Then a stage module, which is assembled and adjusted using another main body module in a second manufacturing line, is mounted on the main body module of the first manufacturing line. Therefore exposure apparatuses can be efficiently manufactured without using dedicated large scale adjustment jigs.

23 Claims, 12 Drawing Sheets

MANUFACTURING METHOD IN MANUFACTURING LINE, MANUFACTURING METHOD FOR EXPOSURE APPARATUS, AND EXPOSURE APPARATUS

BACKGROUND OF THE INVENTION

1. Field of the Invention

The present invention relates to a manufacturing method for products in a manufacturing line having a step of installing a module to a main body, and more particularly to a manufacturing method for an exposure apparatus which is used when a mask pattern is transferred onto a substrate in a lithography step for manufacturing such devices as a semiconductor device, image pickup device (e.g. CCD), liquid crystal display device, plasma display device and a thin film magnetic head. The present invention also relates to an exposure apparatus which is manufactured using this manufacturing method.

2. Description of the Related Art

In a photolithography step for manufacturing semiconductor devices, full field exposure type (stepper type) or scanning exposure type (e.g. step and scan type) exposure apparatuses are used to transfer a pattern of a reticle (e.g. photo mask) as a mask onto a wafer (or glass plate) as a substrate. In these exposure apparatuses, exposure wavelengths are becoming shorter, from KrF excimer laser 248 nm to such a vacuum ultra-violet region as ArF excimer laser 193 nm and $F_2$ laser 157 nm in order to support semiconductor devices which are becoming even smaller at increasing degrees of integration. Also the size of projection optical systems are becoming quite large since a 0.65 or higher numerical aperture is becoming necessary in a wide visual field. In a scanning exposure type exposure apparatus, exposure onto a required size of shot area, while controlling the scale of the projection optical system to a practical range, is becoming possible by setting the scanning direction to a direction which is perpendicular to the direction where the visual field of the projection optical system is widest.

Conventional exposure apparatuses are generally manufactured by installing a box type column on a base panel, installing a wafer stage system at the center of the column, then stacking up each mechanism section of the projection optical system, reticle stage system and illumination optical system on the column. When installing each mechanism section, measurement is performed to check the mutual positional relationship, if necessary, and the positional relationship is adjusted based on this measurement result. In this case, the wafer stage system and reticle stage system are roughly pre-assembled on a dedicated adjustment jig, which is disposed at a location different from the location where the base panel is installed.

As mentioned above, a conventional exposure apparatus is manufactured by a stacking system where each mechanism section is sequentially stacked up, wherein the stage system is pre-assembled using a dedicated adjustment jig. For current exposure apparatuses, however, the sizes of the exposure light source and projection optical system are increasing, and a high throughput is demanded, so in order to improve the operation efficiency of the projection optical system, a double stage type, where two movable stages are used for the wafer stage system, has been proposed. In this type, while exposing a wafer on one movable stage, a wafer on the other movable stage is replaced or aligned so as to improve throughput. For the reticle stage side, as well, a double holder type, where two reticles are held on one movable stage, is being used so that two reticles can be used alternately. The double stage type is disclosed, for example, in PCT International Publication No. WO98/24115 (corresponding to U.S. patent application Ser. No. 09/714,943) or WO98/40791 (corresponding to U.S. Pat. No. 6,262,796), and the double holder is disclosed, for example, in Japanese Patent Application Laid-Open No. 10-209039 (corresponding to U.S. Pat. No. 6,327,022).

However, if a stage system is assembled using a dedicated adjustment jig in a conventional way, with a large size wafer stage system and reticle stage system, the size of the dedicated adjustment jig increases, and the entire installation area of the manufacturing equipment for an exposure apparatus increases too much. Also, it is difficult to prepare such a large size dedicated adjustment jig for each model of exposure apparatus, and even if such a dedicated adjustment jig is prepared, the manufacturing efficiency of exposure apparatuses drops because the operation of the large size dedicated jig. Direct assembly of these stage systems on the column without using an adjustment jig, on the other hand, interfere with the adjustment and installation operation of other mechanical sections, such as the illumination system and projection system. These stage systems also require a performance evaluation before being installed to an exposure apparatus. For this, these stage systems must be pre-assembled as modules before installing to an exposure apparatus.

Also, it is demanded that exposure apparatuses in use today must have a structure which minimizes the influence of vibration to improve the exposure accuracy (e.g. transfer fidelity, alignment accuracy). Especially for scanning exposure type exposure apparatuses, vibration generated by acceleration and deceleration must be decreased because a reticle and wafer are scanned during exposure, with the magnification of the projection optical system as the velocity ratio. However, in the case of an exposure apparatus having a structure where each mechanism section is sequentially stacked up on a base panel, vibration generated in the stage system tends to transfer to each mechanism section, and this vibration also tends to transfer to the projection optical system.

So a structure which can decrease the influence of vibration more than previously has been developed for exposure apparatuses, but even with such a structure, it is generally desirable to manufacture each exposure apparatus in a short time, making the manufacturing efficiency as high as possible. With the foregoing in view, it is a first object of the present invention to provide a manufacturing method for exposure apparatuses which can manufacture exposure apparatuses efficiently without using dedicated large adjustment jigs.

It is a second object of the present invention to provide a manufacturing method for exposure apparatuses which can efficiently manufacture exposure apparatuses having a structure to efficiently decrease the influence of vibration. It is still another object of the present invention to provide an exposure apparatus with a structure suitable for manufacturing using such a manufacturing method, and a manufacturing method for high precision devices using this exposure apparatus. It is still another object of the present invention to improve the operation efficiency and productivity in a manufacturing line having a step of installing a module to a product main body.

SUMMARY OF THE INVENTION

A first manufacturing method for exposure apparatuses according to the present invention is a manufacturing method for manufacturing a product which includes a main body and a first module, comprising manufacturing the first module (91A, 91B) and installing the first module to the main body (90A, 90B) respectively in a plurality of lines, wherein sequences of the plurality of lines are time-shifted, and the first module (91A) manufactured in one line is transferred to another line, and is installed to the main body (90B) in the other line.

According to the manufacturing method of the present invention, the manufacturing space and jig for manufacturing the first module are not required compared with the case of manufacturing the first module outside the line. Also the manufacturing method of the present invention is suitable for a manufacturing line which requires installing or removing a predetermined module to/from the main body at an appropriate time before completion of assembling the final product. For example, in some cases in a manufacturing line of a specific product, such as semiconductor manufacturing equipment, the installation of a predetermined module of the main body must be delayed until the assembly of other modules or the installation thereof to the main body are completed, or a predetermined module must be removed from the main body to install another module or part to the main body or to adjust the characteristics thereof after installing a predetermined module to the main body. Since the sequence of each line is executed at shifted-time according to this invention, the first module assembled in another line is transferred from another line at a timing when installing the first module to the main body is required in one line. Therefore the first module does not interfere with such an operation as the manufacture and adjustment of other modules which has been executed in one line at that timing. Also, by appropriately adjusting the time shift of sequences of a plurality of lines, the mass production efficiency of products by a plurality of lines can be further improved.

In the present invention, the plurality of lines include a first line and a second line, and manufacturing the first module (91A, 91B), manufacturing the second module (IL1, IL2), and installing the first module to the main body (90A, 90B) are repeatedly executed in the first and second line respectively, the sequences of the first line and second line are time-shifted, the first module (91B) manufactured in the second line is transferred to the first line and is installed to the main body (90A) in the first line, and the first module (91A) manufactured in the first line is transferred to the second line, and is installed to the main body (90B) in the second line.

In the above mentioned method, the product can be an exposure apparatus, the main body can be a main body frame of the exposure apparatus, the first module can be the stage system, and the second module can be an illumination system. The stage system can include a stage for moving an object having a transfer pattern and a stage for moving an object to be exposed. In this case, the main body frame of one manufacturing line is used as an adjustment jig of the predetermined mechanism section, so it is unnecessary to provide a separate large scale dedicated adjustment jib, and exposure apparatuses can be efficiently manufactured. Especially when the stage system is a double holder type or double stage type, for example, the stage system thereof is large, so if the present invention makes it unnecessary to install a dedicated adjustment jig, then cost, including manufacturing equipment cost, can be decreased considerably. "Manufacturing line" in this document is a concept which includes not only the work area where parts, modules and assemblies are assembled and installed while being moved to work sites via a conveyer system, but also includes a work area where the assembly of each part and the installation of parts to the main body are performed manually or by using a machine or robot at one or more locations. For example, a manufacturing line for exposure apparatuses includes one section in a clean room, where each main body frame of an exposure apparatus is set, and the exposure apparatus is assembled there.

A second manufacturing method for exposure apparatuses according to the present invention is a manufacturing method for exposure apparatuses which expose a second object (W1) by an exposure beam via a first object (R1) and a projection system (PL), comprising: a first step of assembling a first main body frame (90A) of the exposure apparatus in a first manufacturing line (Step 101); a second step of assembling a second main body frame (90B) of the exposure apparatus in a second manufacturing line (Step 121); a third step of mounting a first adjustment stage (RSTA) at a position where a stage for aligning the first object of the first main body frame is placed in the first manufacturing line, and assembling and adjusting an illumination system (IL1, IL2) to be mounted on the first main body frame (Steps 102, 103); a fourth step of assembling and adjusting a stage system (91B) for aligning the first object and second object using the second main body frame in the second manufacturing line (Steps 122–124); and a fifth step of removing the first adjustment stage from the first main body frame in the first manufacturing line, mounting the projection system (PL) and the stage system (91B) removed from the second main body frame on the first main body frame to assemble the first exposure apparatus (Steps 105–107).

According to the present invention mentioned above, the stage system (91B) assembled and adjusted using the second main body frame (90B) in the second manufacturing line is installed to the first main body frame (90A) on the first manufacturing line, therefore a large scale dedicated adjustment jig for adjusting the stage system is unnecessary. In this case, it is preferable to assemble and adjust the second exposure apparatus using the second main body frame (90B) in the second manufacturing line after the fifth step (Steps 126–129). By this, exposure apparatuses can be manufactured continuously.

The fifth step further comprises, for example: a first sub-step of mounting the projection system on the first main body frame (Step 105); a second sub-step of mounting the second adjustment stage (WSTA) at a position where the stage for aligning the second object on the first main body frame is mounted, and adjusting the projection system (Step 106); a third sub-step for removing the first and second adjustment stages from the first main body frame (first half of Step 107); and a fourth sub-step for mounting the stage system removed from the second main body frame on the first main body frame (latter half of Step 107). In the second manufacturing line, the present invention may further comprise a step of mounting the removed first adjustment stage at a position where the stage for aligning the first object of the second main body frame is placed in the second manufacturing line after removing the stage system from the second main body frame, and assembling and adjusting the illumination system to be mounted on the second main body frame. Also the present invention may further comprise a step of mounting the removed second adjustment stage at a position where the stage for aligning the second object of the second main body frame is placed, and adjusting the projection system.

When the first and second adjustment stages are attached/removed, as mentioned above, it is preferable that the structure of the exposure apparatus is not a structure where each mechanism section is sequentially stacked up on a predetermined base member, but a structure where the stage for the second object is supported by being suspended at the base of the main body frame, and the stage for the first object is supported at the top section of the main body frame. This structure is also a structure which can decrease the influence of vibration, so exposure apparatuses having a structure which can decrease the influence of vibration can be efficiently manufactured by the present invention.

In this case, the first adjustment stage further comprises, for example, a pin hole (64*a*) which can move two dimensionally, and a photo-electric detector (68) which detects the exposure beam which passes through this pin hole by an optical Fourier-transform surface, and the dispersion of the coherence factors of the illumination system can be measured using this adjustment stage.

When the exposure apparatus is a scanning exposure type exposure apparatus which moves the first object and the second object in a predetermined scanning direction synchronously and executes exposure, the first adjustment stage further comprises, for example, a pin hole (64*a*) which can move in a non-scanning direction crossing the scanning direction, and a photo-electric detector (68) which detects the exposure beam which passes through this pin hole, and a substantial two-dimensional illuminance unevenness of the illumination system can be measured using this adjustment stage.

As another example, the first adjustment stage further comprises a slit (64*b*) which can move in a non-scanning direction crossing the scanning direction, and a photodetector (71) which detects the exposure beam which passes through this slit, and a substantial two-dimensional illuminance unevenness of the illumination system can be measured using this adjustment stage. Also it is preferable that the stage system installed to the second main body frame is adjusted based on the positional relationship between the first main body frame and the first adjustment stage, and that the stage system installed to the second main body frame is adjusted based on the positional relationship between the first main body frame and the second adjustment stage.

It is also preferable that a partial illumination system (IL2) at the first object side of the illumination system is installed so as to slide with respect to the first main body frame (90A), so that the partial illumination system is retracted when the first adjustment stage is attached to/removed from the first main body frame and when the stage system is installed. This makes it easier to attach/remove the adjustment stage and to install the stage system.

A first exposure apparatus according to the present invention is an exposure apparatus which exposes a second object (W1) by an exposure beam via a first object (R1) and a projection system (PL), and which comprises an illumination system (IL1, IL2) which has a main body frame (90A) and a partial illumination system (IL2) that is slidable with respect to the main body frame, and illuminates the first object by an exposure beam therefrom, and a stage system (RST, WST) which can be installed to the main body frame when the partial illumination system is retracted from the main body frame, and aligns the first object and the second object.

In this exposure apparatus, the adjustment stage can be easily mounted instead of the stage system in a state where the partial illumination system is retracted, so the exposure apparatus can be manufactured by the manufacturing method of the exposure apparatuses of the present method.

It is preferable that the stage system further comprise a first stage (RST) and a second stage (WST) which align the first object and the second object respectively, where the second stage is supported by being suspended from the main body frame, and the first stage is supported on the main body frame via the vibration proof member (5 or 7).

The main body frame further comprises, for example, a base member (3), a first member (5) which is placed on the base member via a vibration proof member (4), and second members (13, 14, 25) which are placed on the first member via a vibration proof member (6), wherein the partial illumination system of the illumination system is supported on the second member, and the projection system is supported at the base of the second member.

The stage system further comprises a first stage and a second stage which align the first object and the second object respectively, and the first stage (RST), for example, is placed on the first member via a vibration proof member (7).

Also the first stage, for example, is placed on the second member parallel to the partial illumination system.

A second exposure apparatus according to the present invention is an exposure apparatus which illuminates a second object (W1) by an exposure beam via a first object (R1) and a projection system (PL), comprising: a base member (3); and a first member (5) which is placed on the base member via a first vibration proof member (22); second members (13, 14, 25) which are placed on the first member via a second vibration proof member (6) so as to hold the projection system; a first stage (RST) which is supported by the first member so as to align the first object; and a second stage (WST) which is supported by being suspended from the first member so as to align the second object, wherein the first stage and the second stage are removably supported by the first member respectively.

In the above mentioned exposure apparatus, the second stage is supported by being suspended and the first stage is supported to be almost symmetrical to the second stage in the vertical direction, so the influence of vibration is not mutually transferred very much, and the influence of vibration can be decreased. These stages can be easily removed/attached and the adjustment stage can be easily mounted instead of these stages, therefore the exposure apparatus can be manufactured by the manufacturing method for the exposure apparatus of the present invention. In this case, too, if the first stage or the second stage is a double holder type or a double stage type, the effect of eliminating a large scale dedicated adjustment jig is extremely high.

In this case, the first stage, for example, is supported by the first member via a third vibration proof member (7). Because of this, the mutual influence of vibration between the first stage and the second stage is further decreased. Also the first stage, for example, is supported by the second member parallel to the projection system. In this configuration, too, a vibration proof member exists between the second member and the first member, so the mutual influence of vibration between the first stage and the second stage is further decreased. It is preferable that a sensor (24A) for detecting the position of at least one of the second stage and second object is installed to the second member, and using the detection information by this sensor, the position of the second stage can be adjusted. The device manufacturing method of the present invention includes a step of transferring a device pattern onto a work piece (W1) using one of the exposure apparatuses of the present invention. By the device manufacturing method of the present invention, high functioning devices can be manufactured at high precision at low cost.

DESCRIPTION OF THE PREFERRED EMBODIMENTS

An embodiment of the present invention will now be described with reference to FIG. 1–FIG. 9. This example is the case when the present invention is applied to manufacturing a scanning exposure type projection exposure apparatus based on a step-and-scan system.

Figure 1:
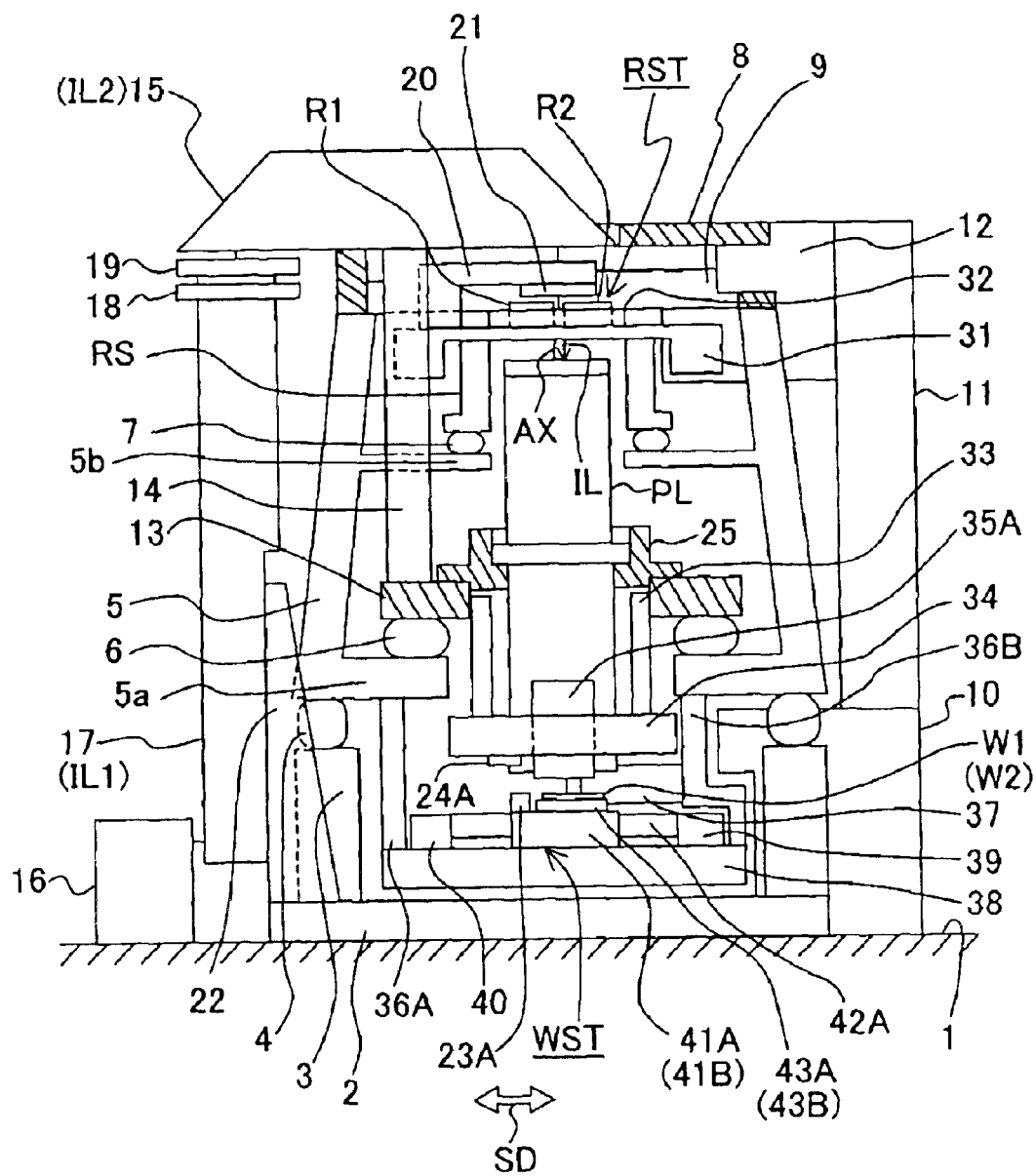
FIG. 1 shows a diagram depicting a configuration of a projection exposure apparatus, which is an example of an embodiment of the present invention, where a part is cut away.

FIG. 1 shows the projection exposure apparatus of this example, and in FIG. 1, the projection exposure apparatus of this example is installed, for example, in a clean room on a floor 1 of a semiconductor device manufacturing factory. For the exposure light source 16 of the projection exposure apparatus, such as an excimer laser light source as KrF (wavelength 248 nm) or ArF (wavelength 193 nm) is used in this example, but an $F_2$ laser light source (wavelength 157 nm), $Kr_2$ laser light source (wavelength 146 nm), YAG laser harmonic generator, semiconductor laser harmonic generator or a mercury lamp can be used.

The exposure light IL, which is an exposure beam emitted from the exposure light source 16 at exposure, enters the first illumination system IL1 in the first sub-chamber 17. The first illumination system IL1 is comprised of a beam matching unit (BMU), beam shaping optical system, optical integrator (uniformizer or homogenizer) to uniform the illuminance distribution, light quantity monitor, variable aperture stop, and relay lens system. The emission face of the first illumination system IL1 is almost conjugate with the pattern face (reticle face) of the reticle, which is an illuminated object, the variable field stop 19 is disposed on the emission face, and the illumination distribution correction filter 18 is for correcting the illuminance distribution in the illumination area is disposed on a nearby face at the incident side of the variable field stop 19 (face defocused from the conjugate face with the reticle face).

The variable field stop 19 opens/closes the visual field so that patterns, other than the original circuit pattern, are not exposed when scanning exposure to each shot area of a wafer, which is the substrate to be exposed, starts or ends. The variable field stop 19 is also configured such that the width of the visual field in a non-scanning direction can be changed according to the size of the transfer target circuit pattern in the non-scanning direction before a scanning exposure. The first illumination system IL1 where the variable field stop 19, which may generate vibration when the viewing field is opened or closed, is disposed, is supported separately from the exposure main body section, and thereby the exposure accuracy in the exposure main body section (alignment accuracy, transfer fidelity) improves.

The exposure light IL, which passes through the variable field stop 19, enters the second illumination system IL2 in the second sub-chamber 15 installed in a predetermined column of the exposure main body section. Also as mentioned later, parts of the members at the emission side of the second illumination system IL2 are installed outside the second sub-chamber 15. The second illumination system IL2 includes a relay lens system, mirror for bending an optical path, capacitor lens system, and a fixed field stop 21, and the exposure light IL, which passes through the second illumination system IL2, illuminates the illumination area on the pattern face (reticle face) of the reticle R1 (or R2) as a mask. The fixed field stop 21 of this example is secured to the bottom face of the reticle alignment section 20 where a reticle alignment microscope is disposed for aligning the reticles R1 and R2. In other words, the fixed field stop 21 is disposed on a face which is defocused for a predetermined amount from the top face adjacent to the reticles R1 and R2, that is, the reticle face. An opening to regulate the illumination area on the reticle face to be a slit area elongated in a non-scanning direction perpendicular to the scanning direction is formed on the fixed field stop 21. The fixed field stop 21 may be disposed near the conjugate face with the reticle face, that is, near the installation face of the variable field stop 19, for example. In this example, the illumination system (illumination optical system) is comprised of the first illumination system IL1 and the second illumination system IL2.

The image of the pattern in the illumination area of the reticle R1 (or R2) is projected under the exposure light IL onto the slit type exposure area on the wafer W1 (or W2) where photo-resist is coated, as a photo-sensitive substrate (substrate to be exposed) at projection magnification β (e.g. β is ¼ or ⅕) via the projection optical system PL, which is the projection system for exposure. In this state, the reticle R1 and the wafer W1 are synchronously moved in a predetermined scanning direction with projection magnification β as the velocity ratio, then the pattern image of the reticle R1 is transferred to one shot area on the wafer W1. The reticles R1 and R2 correspond to the first object of the present invention, the wafers W1 and W2 correspond to the second object of the present invention, and the wafers W1 and W2 are, for example, disk type substrates made from semiconductor (e.g. silicon) or SOI (Silicon-On-Insulator).

The configuration of the projection optical system PL will be described later, but now the projection optical system PL will be described using the Z axis, which is parallel to the optical axis AX of the projection optical system PL, the X axis, which is on a plane perpendicular to the Z axis (this roughly matches the horizontal plane in this example) and is along a non-scanning direction perpendicular to the scanning direction SD of the reticle R1 and wafer W1 during scanning exposure (that is, a direction perpendicular to the paper face in FIG. 1), and the Y axis, which is along the scanning direction SD thereof (that is, a direction parallel to the paper face in FIG. 1).

Initially a general configuration of the exposure main body section, including the stage system which supports the reticles R1 and R2, projection optical system PL, and the stage system which supports the wafers W1 and W2 in this example, will be described. In other words, the roughly rectangular plate type frame caster 2 is installed to the floor 1, and the first sub-chamber 17, where the first illumination system IL1 is stored, is secured at the edge in the +Y direction of the frame caster 2 via the first illumination system support section 22. The cylindrical main body support section 3 is installed respectively at three locations roughly corresponding to the vertex of the equilateral triangle at the peripheral portion of the top face of the frame caster 2, the main body column 5 is installed to the top face of the three main body support sections 3 via the active vibration proof stand 4, and an electric level or an optical displacement sensor (not illustrated), such as a tilt angle detector, is installed to the main body column 5. The active vibration proof stand 4 includes an air damper or a mechanical damper which withstands heavy weight, such as a hydraulic damper, and an electro-magnetic damper, which is comprised of an electro-magnetic actuator, such as a voice coil motor, and for example, the electro-magnetic dampers in the three active vibration proof stands 4 are driven and the pneumatics or hydraulics of the mechanical damper is controlled if necessary so that the tilt angle of the top face of the sub-column 5a at the bottom end of the main body column 5 detected by the displacement sensor, with respect to the horizontal plane, is controlled to within tolerance. In this case, the high frequency vibration from the floor is attenuated by the mechanical damper before [vibration] is propagated to the exposure main body section, and the remaining low frequency vibration is attenuated by the electro-magnetic damper.

A reticle chamber 8, which is an air tight chamber to cover the later mentioned reticle stage system RST is installed on the top face of the main body column 5, and a rectangular frame-shaped reticle drive mechanism 9, for driving the micro-movement stage 32 of the reticle stage system RST in the scanning direction at a predetermined speed so as to correct synchronization errors, are installed inside of the reticle chamber 8.

The sub-chamber 5b protrudes at a position at the middle height of the main body column 5, and the reticle support section RS is installed to the top face of the sub-column 5b via the three active vibration proof stands 7 located roughly at the vertex of the equilateral triangle, the reticle base 31, which is a base member, is secured to the top face of the reticle support section RS, and an opening for the exposure light IL to pass through is formed at the center of the reticle base 31. The top face of the reticle base 31 is processed to be a guide face which has an extremely fine flatness, and the finely moving stage 32, which is a movable stage at the reticle side, is placed on the guide face via the air bearing so as to smoothly slide two-dimensionally, and two reticles R1 and R2 are held onto the finely moving stage 32 by vacuum suction. The reticles R1 and R2 on the finely moving stage 32 are held by a double holder type so as to be adjacent to each other in the scanning direction, so that double exposure, for example, can be efficiently executed. The support section of the reticle alignment section 20 is secured at the edge of the reticle base 31 in the +Y direction, and the reticle alignment microscope and the fixed field stop 21 are installed in the reticle alignment section 20, as mentioned above.

The active vibration proof stand 7 has the same configuration as the active vibration proof stand 4 (the withstand load, however, is set to be lower than the active vibration proof stand 4), and an electric level or an optical displacement sensor (not illustrated), such as a tilt angle detector, is installed at the edge of the guide face of the reticle base 31. For example, operation of the three active vibration proof stands 7 is controlled so that the tilt angle of the guide face detected by the displacement sensor (tilt angle around the 2 axes, that is, around the X axis and the Y axis) with respect to the horizontal plane is maintained to within tolerance.

The above mentioned reticle drive mechanism 9 is disposed surrounding the finely moving stage 32 in this example, and the reticle drive mechanism 9 is comprised of a coarse motion stage driven at a predetermined speed alternately in the +Y direction and the −Y direction, and an actuator, which drives the finely moving stage 32 with respect to the coarse motion stage for a micro-amount in the X direction, the Y direction, and the rotating direction within a predetermined small range. The two-dimensional position and the rotation angle of the finely moving stage 32 and the position of the coarsely moving stage in the Y direction are measured at high precision by the laser interferometer, not illustrated, respectively, and the position and the speed of the finely moving stage 32 are controlled based on this measurement result.

In this example, the reticle stage system RST is comprised of the reticle base 31, the finely moving stage 32, the reticle drive mechanism 9, and the laser interferometer, which is not illustrated. The configuration of the reticle stage system RST is disclosed, for example, in Japanese Patent Application Laid-Open No. 10-209039 (corresponding to U.S. Pat. No. 6,327,022), the contents of which are incorporated herein by reference. The reticle stage system RST in this example is a double holder type, but the reticle stage system RST may be a double reticle stage type where two reticles are placed on independent movable stages (single holder type) or may be a single holder type single stage where one reticle is used.

On the top face of the sub-column 5a at the bottom edge of the main body column 5, a projection system column 13, where a U-shaped opening is formed at the center, is supported via the three active vibration proof stands 6 located roughly at the vertex of the equilateral triangle, and the projection optical system PL, where a flange section is at the center, is installed to the opening of the projection system column 13 via a ring-shaped sub-column 25. The active vibration proof stand 6 has the same configuration as the active vibration proof stand 4 (the withstand load, however, is set to be lower than the active vibration proof stand 4), and an electric level or an optical displacement sensor (not illustrated), such as a tilt angle detector, is installed to the top face of the projection system column 13. For example, operation of the three active vibration proof stands 6 is controlled so that the tilt angle of the top face of the projection system column 13, with respect to the horizontal plane, detected by the displacement sensor (tile angle around the two axes, that is, around the X axis and the Y axis), is maintained to within tolerance.

The cylindrical second illumination support section 14 is secured to the top face of the projection system column 13 at the sub-chamber 17 side, and the second sub-chamber 15 (where the second illumination system IL2 is housed) is supported at the top edge of the illumination system support section 14. Therefore in this example, the second illumination system IL2 and the projection optical system PL are supported on a common active vibration proof stand 6, so the image formation characteristic of the projection optical system PL is stably maintained.

The flat plate-shaped sensor column 34, where an opening to pass through the projection optical system PL is formed at the center, is supported by being suspended from the bottom face of the projection system column 13 via two sub-columns 33, and the off-axis type FIA (Field Image Alignment) image formation system alignment sensor 35A is secured to this sensor column 34. Another alignment sensor 35B (see FIG. 2) is disposed with the alignment sensor 35A so as to sandwich the projection optical system PL in the X direction. The light receiving section 24A for detecting a predetermined luminous flux from the wafer stage is installed to the sensor column 34, so that the position of the wafer stage, with respect to the projection optical system PL, can be measured by this light receiving section 24A. The auto focus sensor (not illustrated), for measuring the defocus amount of the exposure target wafer surface from the image surface of the projection optical system PL is also installed to the sensor column 34.

Now the wafer stage system of the present example will be described in detail. Initially the wafer base 38, which is a base member comprised of a small base panel, is supported be being suspended from the bottom face of the sub-column 5a at the bottom edge of the main body column 5 via the wafer stage suspension sections 36A and 36B at two locations arranged facing each other in the Y direction. The top face of the wafer base 38 is processed to be a guide face which has an extremely fine flatness, and the first wafer stage 41A is placed on the guide face via the air bearing so as to smoothly slide two-dimensionally along the Y axis slider 42A and the X axis linear guides 39 and 40, and the first wafer W1 is held onto the wafer stage 41A via the wafer holder 43A by vacuum suction, for example.

The wafer stage 41A moves continuously in the Y direction by the linear motor system, for example, and also moves in steps in the X direction and the Y direction. Also a sample stand is built inside the wafer stage 41A, which micro-drives the wafer W1 in three degrees of freedom, that is, in the X direction, the Y direction and the rotation direction around the Z axis, and drives the wafer W1 in three degrees of freedom, that is, for displacement in the Z direction and in the tilt angles around the 2 axes (this is around the X axis and the Y axis) to execute leveling and focusing.

In this example, the second wafer stage 41B, along with the first wafer stage 41A, is placed on the wafer base 38 so as to move freely via the air bearing, and the second wafer W2 is placed on the wafer stage 41B via the wafer holder 43B. The second wafer stage 41B is also driven two-dimensionally by a linear motor system, for example, so as not to mechanically interfere with the wafer stage 41A. The double wafer stage type (or twin stage type) wafer stage system WST of this example is comprised of a wafer base 38, wafer stages 41A and 41B, wafer holders 43A and 43B, and a drive mechanism thereof. In this configuration, the wafer W2 can be replaced and aligned at the second wafer stage 41B side when a scanning exposure is being executed on the wafer W1 at the first wafer stage 41A side, for example, so high throughput can be implemented.

The two-dimensional position, yawing amount, pitching amount, and rolling amount of the wafer stages 41A and 41B are measured at high precision by the laser interferometer, which is not illustrated, the focus position (position in the optical axis direction of the projection optical system PL) and the tile angle of the wafers W1 and W2 during exposure are measured by the auto focus sensor, which is not illustrated, and the positions of the wafer stages 41A and 41B, and the focus position and tile angle of the wafers W1 and W2 are controlled based on these measurement values.

In FIG. 1, the pre-alignment mechanism 37 for executing pre-alignment of the wafers W1 and W2 is disposed above the wafer stage system WST via the wafer stage suspension section 36B. Also the wafer loader system 10 is disposed adjacent to the exposure main body section in the −Y direction, on which the reticle loader system 11 is installed, and the reticle replacement section 12 is disposed between the reticle loader system 11 and the reticle stage system RST.

Now the configuration of the double wafer stage type wafer stage system WST of this example will be described in detail with reference to FIG. 2.

Figure 2:
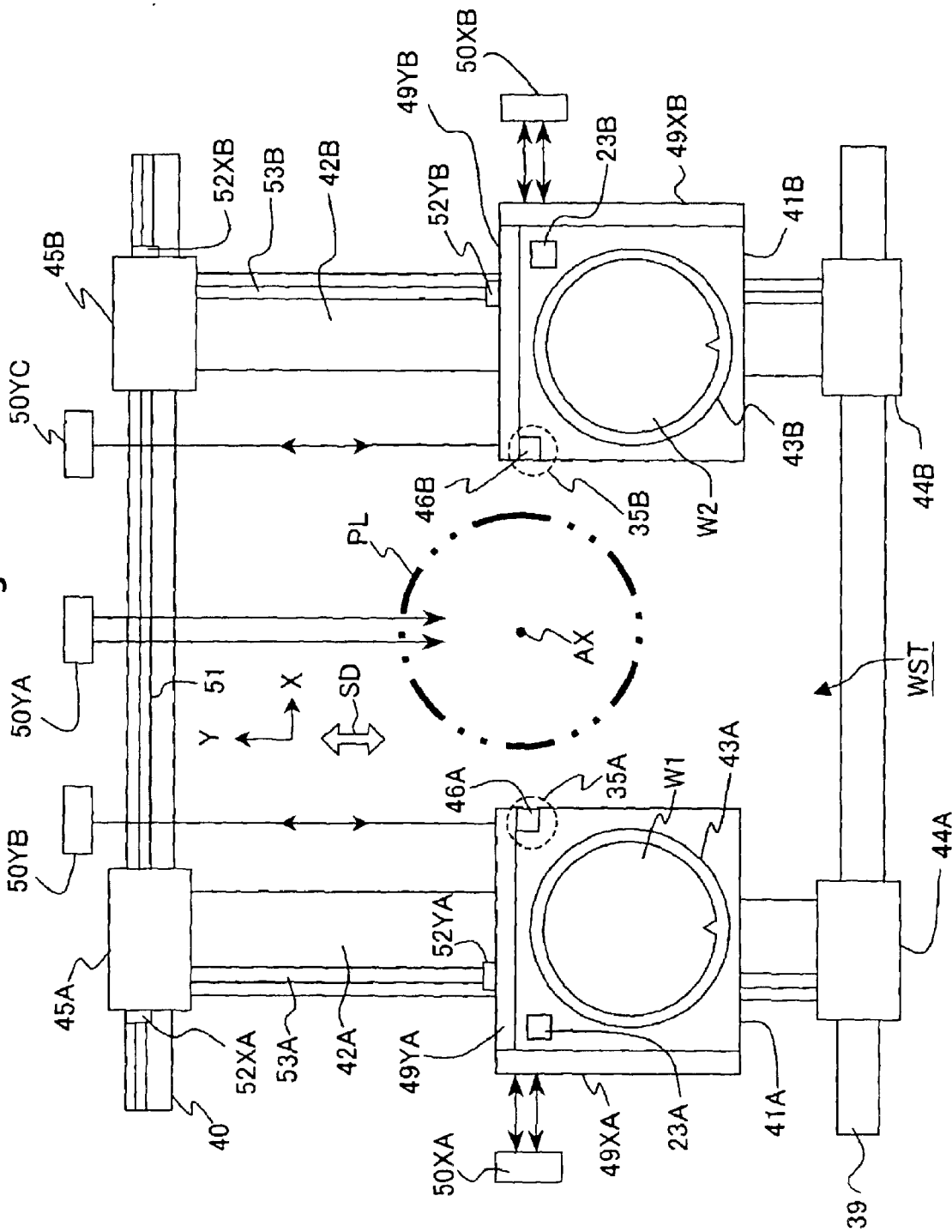
FIG. 2 shows a plan view depicting the wafer stage system in FIG. 1.

FIG. 2 is a plan view depicting the wafer stage system WST in FIG. 1, and as FIG. 2 shows, a pair of alignment sensors 35A and 35B for wafer alignment are disposed sandwiching the projection optical system PL in the X direction (non-scanning direction) in this example. And a pair of X axis linear guides 39 and 40 are secured parallel to the X axis sandwiching the two wafer stages 41A and 41B of the wafer stage system WST of this example, in the scanning direction SD (Y direction) during a scanning exposure. A first pair of X axis sliders 44A and 45A are placed on the X axis linear guides 39 and 40 via an air pad respectively so as to be slidable in the X direction, the first Y axis slider 42A stretching in the Y direction is disposed on the X sliders 44A and 45A via an air pad respectively so as to be slidable in the Y direction, and the first wafer stage 41A is disposed on the Y axis slider 42A via an air pad so as to be slidable in the Y direction.

Also the X axis linear motor (not illustrated), for relative driving of the X axis sliders 44A and 45A on the X axis linear guides 39 and 40 in the X direction respectively, and the Y axis linear motor (not illustrated), for relative driving of the wafer stage 41A on the Y axis slider 42A in the Y direction, are installed. In this example, the Y axis slider 42A is supported so as to move on the X axis sliders 44A and 45A in the Y direction, and the wafer stage 41A is driven on the Y axis slider 42A in the Y direction (scanning direction) so that the law of momentum conservation is satisfied. By this, vibration during scanning exposure is decreased and exposure accuracy is improved. At this time, the moving mirror 49XA on the X axis and the moving mirror 49YA on the Y axis are disposed on the side face at the −X direction side and on the side face on the +Y direction side of the wafer stage 41A respectively, in order to measure the position and rotation angle of the wafer stage 41A on the XY plane.

Also a second pair of X axis sliders 44B and 45B are placed parallel to the pair of X axis sliders 44A and 45A on the X axis linear guides 39 and 40 via an air pad respectively so as to be slidable in the X direction, the second Y axis slider 42B is disposed on the X axis sliders 44B and 45B via an air pad respectively so as to be slidable in the Y direction, and the second wafer stage 41B is disposed on the Y axis slider 42B via an air pad so as to move relatively in the Y direction. For the wafer stage 41B, as well, the X axis linear motor (not illustrated) for relatively driving the X axis sliders 44B and 45B on the X axis linear guides 39 and 40 in the X direction, and the Y axis linear motor (not illustrated) for relatively driving the wafer stage 41B on the Y axis slider 42B in the Y direction are installed.

In the constitution of double wafer stage (twin stage) of this example, the first wafer stage 41A and the second wafer stage 41B use the exposure area of the projection optical system PL, half of the surface of the wafer base 38 at the −X direction side and half of the surface at the +X direction side as a main area in which the wafer is movable respectively, and while an exposure is executed at one wafer stage, wafer replacement and wafer alignment are executed on the other wafer stage. The alignment sensor 35A at the −X direction side of the projection optical system PL is used when the wafer W1 on the first wafer stage 41A is aligned, and the alignment sensor 35B at the +X direction side is used when the wafer W2 on the second wafer stage 41B is aligned.

In order to measure the base line amount (space between the detection center and exposure center) of the alignment sensor 35A, the reference mark member 46A, where a predetermined reference mark is formed, is secured to the upper right edge of the top face of the first wafer stage 41A. A reference mark to be used for aligning the reticles R1 and R2 using the reticle alignment microscope installed at the reticle alignment section 20 in FIG. 1 is also formed on the reference mark member 46A. In this second wafer stage 41B, on the other hand, the moving mirror 49XB on the X axis and the moving mirror 49YB on the Y axis are secured to the edge at the +X direction side and to the edge at the +Y direction side respectively, and the reference mark member 46B for a base line check of the alignment sensor 35B and for reticle alignment is secured to the upper left edge of the wafer stage 41B. In other words, these two wafer stages 41A and 41B are configured to be roughly symmetrical with respect to an axis parallel to the Y axis. The end faces of the wafer stages 41A and 41B may be mirror-finished to be reflection faces so as to be used instead of the moving mirrors 49XA, 49YA, 49XB and 49YB.

Also in FIG. 2, a wafer loader system (not illustrated) for the first wafer stage 41A is disposed at the −X direction side on the front side (−Y direction side) of the X axis linear guide 39, and the wafer loader system (not illustrated) for the second wafer stage 41B is disposed at the +X direction side. The light emitting sections 23A and 23B are disposed on the wafer stages 41A and 41B respectively. The light emitting section 23A generates luminous flux to indicate the position of the wafer stage 41A to the light receiving section 24A in FIG. 1, and the light emitting section 23B generates luminous flux to indicate the position of the wafer stage 41B to the corresponding light receiving section.

An example of the measurement system of the wafer stage system WST of this example will now be described. In FIG. 2, the optical axis AX of the projection optical system PL (exposure center), the optical axis of the first alignment sensor 35A (detection center), and the optical axis of the second alignment sensor 35B (detection center), are arranged on lines parallel to the X axis. And the two measurement beams, for which a symmetric axis is an axis which passes through the optical axis AX and is parallel to the X axis, are irradiated from the laser interferometer 50XA in the −X direction onto the moving mirror 49AX of the X axis of the first wafer stage 41A. And the two measurement beams, which are symmetrical with the measurement beams with respect to the optical axis AX, are irradiated onto the moving mirror 49XB of the X axis of the second wafer stage 41B from the laser interferometer 50XB in the +X direction. In addition to these two measurement beams, measurement beams which are actually distant in the Z direction are also irradiated onto the moving mirrors 49XA and 49XB, and the laser interferometers 50XA and 50XB measure the positions in the X direction, rotation angle around the Z axis (yawing amount) and rotation angle around the Y axis (rolling amount) of the wafer stages 41A and 41B, respectively. Each measurement value of the laser interferometers 50XA and 50XB is used for both at exposure using the projection optical system PL and when using the alignment sensor 35A or 35B.

Two measurement beams having a symmetric axis which pass through the optical axis AX and which are parallel to the Y axis are irradiated from the laser interferometer 50YA. In addition to the measurement beams, a measurement beam which is distant in the Z direction is included, and these measurement beams are irradiated onto either the moving mirror 49YA in the Y axis of the wafer stage 41A or onto the moving mirror 49YB in the Y axis of the wafer stage 41B, and the position of the wafer stage 41A (or 41B) during a scanning exposure in the Y direction, the rotation angle around the Z axis (yawing amount) and the rotation angle around the X axis (pitching amount) are measured by the laser interferometer 50YA. The laser interferometers 50YB and 50YC having measurement beams which pass through the respective detection centers of the alignment sensors 35A and 35B and which are parallel to the Y axis are also installed. In the case of this example, the measurement values of the laser interferometer 50YA at the center are used for measuring the positions of the wafer stages 41A and 41B in the Y direction during exposure using the projection optical system PL, and the measurement values of the laser interferometer 50YB or 50YC are used for measuring the positions of the wafer stages 41A or 41B in the Y direction respectively when the alignment sensor 35A or 35B is used. The resolution of the measurement values of the laser interferometers 50XA, 50XB and 50YA-50YC is about 0.6–5 nm (0.0006–0.005 μm), for example.

These laser interferometers 50XA, 50XB and 50YA–50YC for the wafer stage system WST are secured to the sensor column 34 in FIG. 1.

When the alignment operation is shifting to the exposure operation, or when the wafer replacement operation is shifting to the alignment operation, for example, the measurement beams from the laser interferometers 50XA and 50YA may deviate from the moving mirror 49XA of the wafer stages 41A and 41B, and measurement of the positions of the wafer stages 41A and 41B may be impossible. For such a case, optical, magnetic or capacitance type linear encoder scales 51, 53A and 53B are secured to the X axis linear guide 40 and to the Y axis sliders 42A and 42B respectively, and to read these scales, the X axis detectors 52XA and 52XB and the Y axis detectors 52YA and 52YB are installed to the X axis sliders 45A and 45B and to the wafer stages 41A and 41B respectively. By these detectors 52XA, 52XB, 52YA and 52YB of the linear encoders, the X coordinate and the Y coordinate of the wafers stages 41A and 41B are roughly measured at about a 1 μm resolution, for example, within all the strokes of the wafer stages 41A and 41B.

When alignment ends and shifts to the exposure operation for the wafer stage 41A in FIG. 2, for example, the laser interferometer 50YB in the Y axis is switched to the laser interferometer 50YA. In order to substantially transfer the Y coordinate from the laser interferometer 50YB to the laser interferometer 50YA at high precision at this time, the yawing amount of the wafer stage 41A, measured by the laser interferometer 50XA, is set to a predetermined value in a state where the measurement beams from the laser interferometers 50YA and 50YB on the 2 axes are simultaneously irradiated onto the moving mirror 49YA of the wafer stage 41A, for example, then the measurement values of the laser interferometer 50YB are preset to the measurement values of the laser interferometer 50YA.

Another method, for example, is when the length of the moving mirror 49YA in the X direction is shorter than the space between the measurement beams of the laser interferometers 50YB and 50YA, the origin of the Y coordinate may be set with the detection center of the alignment sensor 35A as the reference using the reference mark member 46A of the wafer stage 41A at alignment, and the original of the Y coordinate may be set with the exposure center as the reference using the reference mark member 46A and the reticle alignment microscope at the exposure. In this method, the wafer stage 41A is driven based on the measurement values of the detector 52YA of the linear encoder of the Y axis in the block where the measurement beams from the laser interferometers 50YB and 50YA are not irradiated onto the moving mirror 49YA.

As mentioned above, the measurement system of the wafer stage system WST of this example is comprised of the laser interferometers 50XA and 50XB of the X axis, the laser interferometers 50YA–50YC of the Y axis, the linear encoders (51, 52XA, 52XB) of the X axis, and the linear encoders (53A, 53B, 52YA and 52YB) of the Y axis. In the same way, the measurement system of the reticle stage system RST in FIG. 1 is comprised of the laser interferometer (not illustrated) for measuring two-dimensional positions in the XY plane of the reticle stage 32 (finely moving stage), and the laser interferometer (not illustrated) for measuring the position of the coarse motion stage in the Y direction within the reticle drive mechanism 9, and these laser interferometers are secured to the reticle base 31.

When the exposure light IL of the projection exposure apparatus of this example is substantially light outside the vacuum ultra violet region, such as an ArF excimer laser (wavelength 193 nm) or an $F_2$ laser (wavelength 157 nm), the absorption rate is high in normal air, so one or more types of purge gases selected from nitrogen, which transmits vacuum ultra violet light, and gas groups containing rare gases (helium, neon, argon, krypton, xenon, radon) and others must be supplied to the optical path of the exposure light IL from the exposure light source 16 to the wafer stages 41A and 41B. For this, the space enclosing the sub-chambers 17 and 15 and the reticle stage system RST (reticle chamber 8), the inside of the projection optical system PL and the space enclosing the wafer stage system WST which are air tight, and the gas inside, are substituted with a purge gas.

An example of the manufacturing method of the projection exposure apparatus of this example will now be described with reference to FIG. 3–FIG. 9. In this example, the projection exposure apparatus is divided into a main body module (main body frame), illumination system (illumination module), projection optical system PL (lens module), stage module and loader module, and essentially each module is assembled and adjusted separately, and a plurality of modules are linked at a predetermined stage so as to manufacture one projection exposure apparatus. This manufacturing is executed in a temperature controlled clean room.

Initially the configuration of each module will be described.

Figure 3:
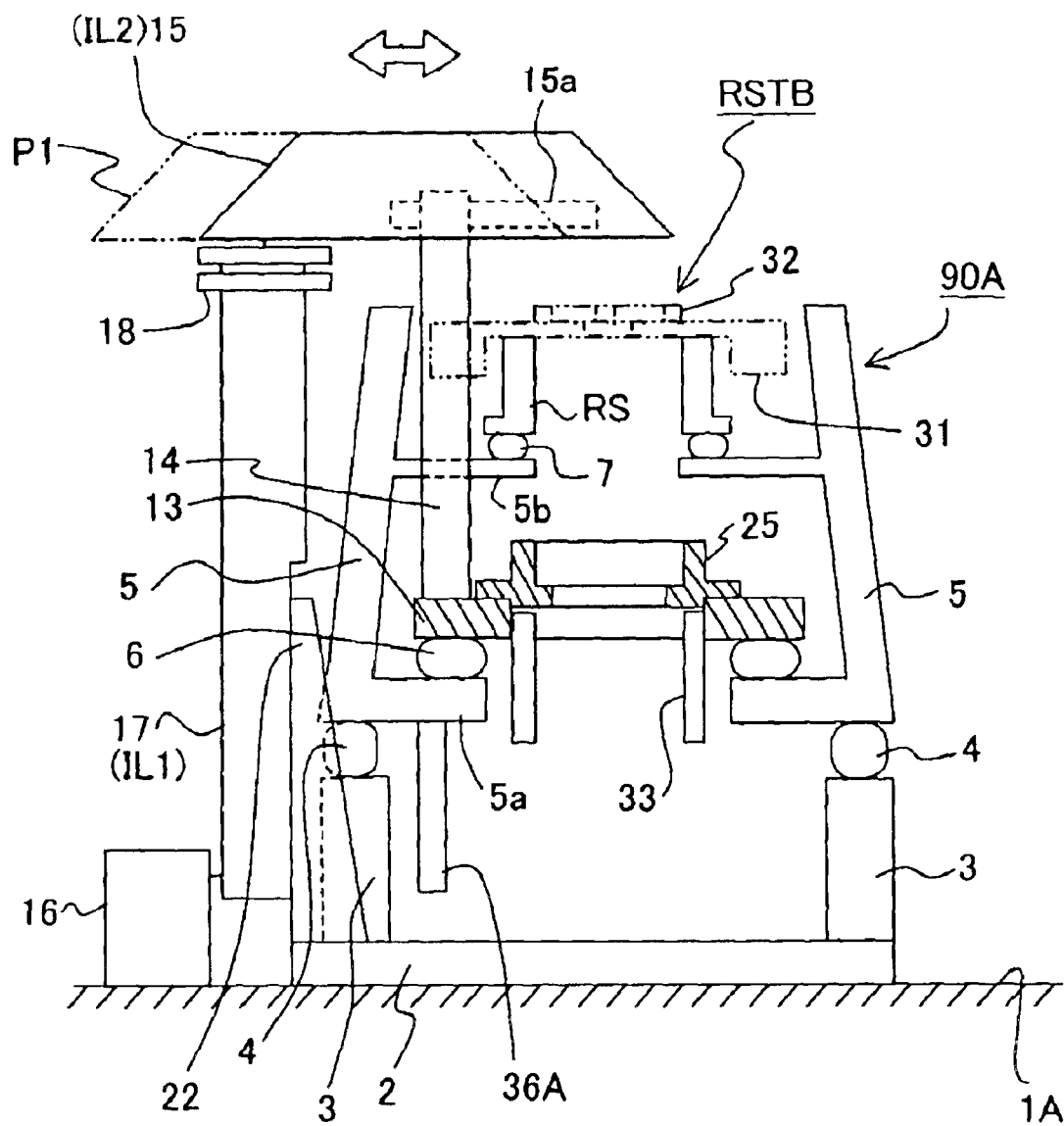
FIG. 3 shows a diagram depicting a configuration of the main body module 90A and the illumination system of the projection exposure apparatus during manufacturing in the first manufacturing line, where a part is cut away.

FIG. 3 shows the main body module and the illumination module, and in FIG. 3, the main body module 90A, which is the main body frame indicated by a continuous line, is comprised of a frame caster 2, a main body support section 3, active vibration proof stands 4, 6 and 7, a main body column 5, a projection system column 13, a sub-column 25, an illumination system support section 14, a reticle support section RS, a sub-column 33, and one side of the wafer stage suspension section 36A. The illumination module of this example, on the other hand, is comprised of an exposure light source 16, a first illumination system IL1 housed in a sub-chamber 17, and a second illumination system IL2, which is a partial illumination system, housed in a sub-chamber 15. The sub-chamber 17 (first illumination system IL1) is secured to the illumination system support section 22, which is secured to the frame caster 2, and the sub-chamber 15 (second illumination system IL2) is secured to the top edge of the illumination system support section 14, which is secured to the projection system column 13.

A guide shaft 15a is installed parallel to the Y direction (scanning direction) inside the sub-chamber 15, and is configured such that the guide shaft 15a and the sub-chamber 15 (second illumination system IL2) can be shifted in the Y direction with respect to the illumination system support section 14. The guide shaft 15a can be comprised, for example, of a ball screw and actuator engaged in the illumination system support section 14 so as to be slidable on the illumination system support section 14. Also a limit switch, for example, can be installed in a state where the sub-chamber 15 is secured to a position at the exposure, so that the sub-chamber 15 can be repeatedly aligned to that position at exposure with 0.1 mm reproducibility, for example. According to this example, when the reticle stage system is installed to the main body module 90A, for example, the sub-chamber 15 (second illumination system IL2) is retracted to the position P1 indicated by a two-dot chain line with respect to the illumination system support section 14, so that the attachment/removal operation for the reticle stage system becomes easier. After the attachment/removal operation ends, the sub-chamber 15 is slid to the above mentioned position of the limit switch with respect to the illumination system support section 14, then the sub-chamber 15 (second illumination system IL2) can be quickly returned to the position at exposure.

Figure 4A:
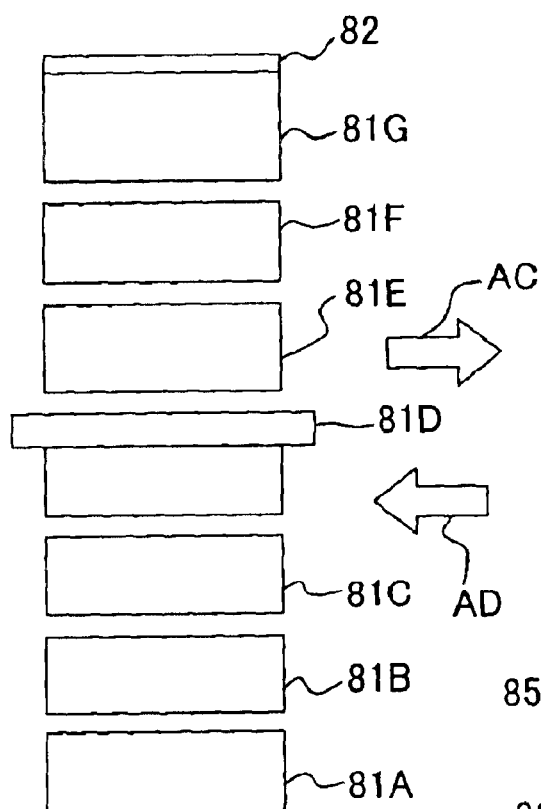
FIGS. 4A and 4B show diagrams depicting the structure of the projection optical system PL in FIG. 1 and the manufacturing method thereof.
Figure 4B:
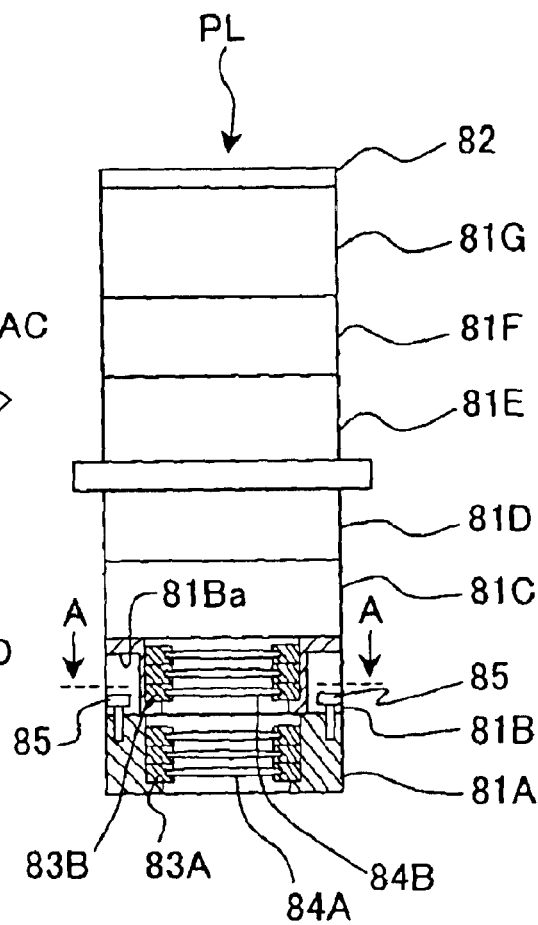

FIG. 4B shows the projection optical system PL (lens module) of this example, and in FIG. 4B, the projection optical system PL is comprised of a plurality of (7 in this example) split lens barrels, 81A, 81B, . . . 81G, which are linked in the optical axis direction, where a plurality of different lenses, 84A and 84B, are housed in the split lens barrels at the lowest levels, 81A and 81B, via the lens frames 83A and 83B respectively, and a lens or a concave mirror is also housed in the other split lens barrels 81C–81G. These lenses include an aspherical lens. A flange section for securing is installed in the split lens barrel 81D, which is at the center, and an aberration correction section 82, where an aberration correction plate is housed, is installed to the top end of the split lens barrel 81G at the highest level. A drive mechanism, for driving predetermined lenses in the optical axis direction and in one of the rotation directions around the two orthogonal axes on a plane perpendicular to the optical axis, is built into the split lens barrels 81E–81G at the top, for correcting the image formation characteristics of the projection optical system PL.

Figure 5:
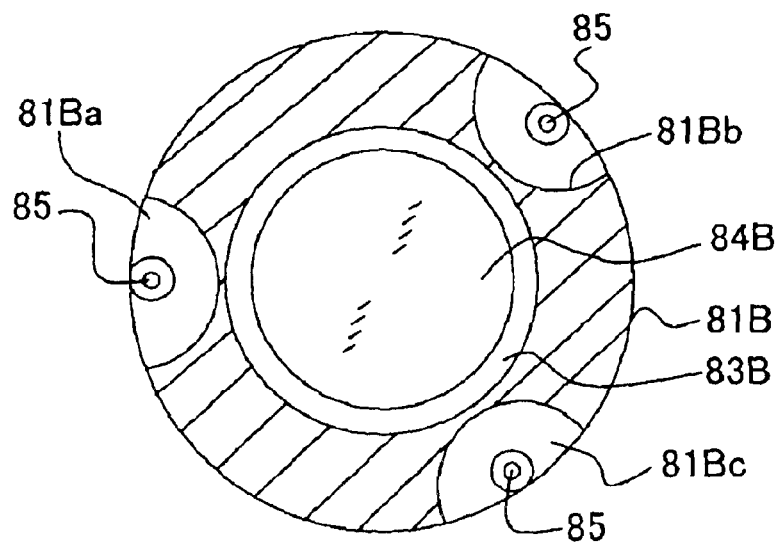
FIG. 5 shows a cross-sectional view along the line AA in FIG. 4B.

As shown in FIG. 5, which is a cross-sectional view of FIG. 4B, notches 81Ba–81Bc and through holes are formed along the line A—A in the split lens barrel 81B at three locations at equal intervals, and bolts 85 are disposed respectively at these notches 81Ba–81Bc. Corresponding to these bolts, screw holes are formed at three locations on the top face of the split lens barrels 81A at the level below, and adjacent split lens barrels 81A and 81B are linked by bolts 85 at the three locations in the optical axis direction. In this case, the optical axis between the split lens barrels 81A and 81B can be adjusted by the clearance between the through holes formed in the notches 81Ba–81Bc and the outer diameter of the bolts 85. In the same way, the adjacent split lens barrels 81B–81G on the levels above are also linked by the bolts, which are not illustrated, in a state where the optical axis can be adjusted. By housing the bolts 85 in the notches 81Ba–81Bc, the entire projection optical system PL can be downsized.

To manufacture the projection optical system PL of this example, each split lens barrel 81A–81G is independently assembled first, as shown in FIG. 4A. Then as arrow AC shows, the split lens barrels 81A–81G are linked while adjusting the optical axis. Then the wave front aberration is measured for the entire projection optical system PL, and the Petzval sum is determined. If the wave front aberration and the Petzval sum exceed tolerance, the projection optical system PL is disassembled into individual split lens barrels 81A–81G again, as arrow AD shows, and the split lens barrel causing the wave front aberration defect is readjusted. If the Petzval sum is defective, the lens causing the defect is repolished or replaced. Then as arrow AC shows, the split lens barrels 81A–81G are linked, and assembly and adjustment of the projection optical system PL completes when both the wave front aberration and Petzval sum come within tolerance.

In the step of assembling and adjusting the projection optical system PL, it is preferable to calculate the high order elements of such aberrations as distortion and curvature of an image field as well, using Zernike's polynomial, for example, based on the wave front aberration measured as described above, and to replace or adjust at least a part of the projection optical system PL based on this calculation result. At this time, the projection optical system PL can be replaced in the optical element unit or in the split lens barrel unit. For the above mentioned adjustment, at least one optical element of the projection optical system PL may be processed again, and especially for the lens element, the surface thereof may be processed to have an aspherical surface if necessary. This optical element is not only a dioptric element, such as a lens element, but may also be a cata-dioptric element, such as a concave mirror, or an aberration correction plate for correcting the aberration (e.g. distortion, spherical aberration) of the projection optical system, particularly for correcting non-rotational symmetrical components. For the adjustment of the projection optical system PL, only the position (including space with another optical element) and inclination of the optical element may be changed, but when the optical element is a lens element, decentering thereof may be changed or the lens element may be rotated with the optical axis at the center.

When optical adjustment is executed for the projection optical system PL by measuring the wave front aberration again after the projection optical system PL is installed to the main body module (main body frame) as well, the optical element may be changed or processed again. The projection optical system PL has a drive mechanism built in to drive at least one optical element by a piezo element to adjust the image formation characteristics, so depending on the above mentioned calculation result, the optical characteristics (e.g. such aberrations as distortion, or wave front aberration) may be controlled within tolerance only by adjusting this drive mechanism.

The projection optical system PL of this example is comprised of a dioptric system as an example, but a cylindrical type cata-dioptric optical system, which is comprised of a plurality of dioptric lenses along one axis and two concave mirrors which have openings near the optical axis respectively, may be used as the projection optical system PL, as disclosed in PCT International Publication No. WO00/39623. Also a cata-dioptric system which has a V-shaped bent optical axis and forms an immediate image twice inside, as disclosed in PCT International Publication No. WO01/65296, or a cata-dioptric system which has a V-shaped bent optical axis and forms an intermediate image once inside, as disclosed in Japanese Patent Application Laid-Open No. 2000-47114, may be used as the projection optical system PL. The contents of PCT International Publication No. WO00/39623 (corresponding to U.S. patent application Ser. No. 09/644645), PCT International Publication No. WO01/65296 (corresponding to U.S. patent application Ser. No. 09/769,832), and Japanese Patent Application Laid-Open No. 2000-47114 (corresponding to U.S. patent application Ser. No. 09/094,579), are incorporated herein by reference.

Figure 7:
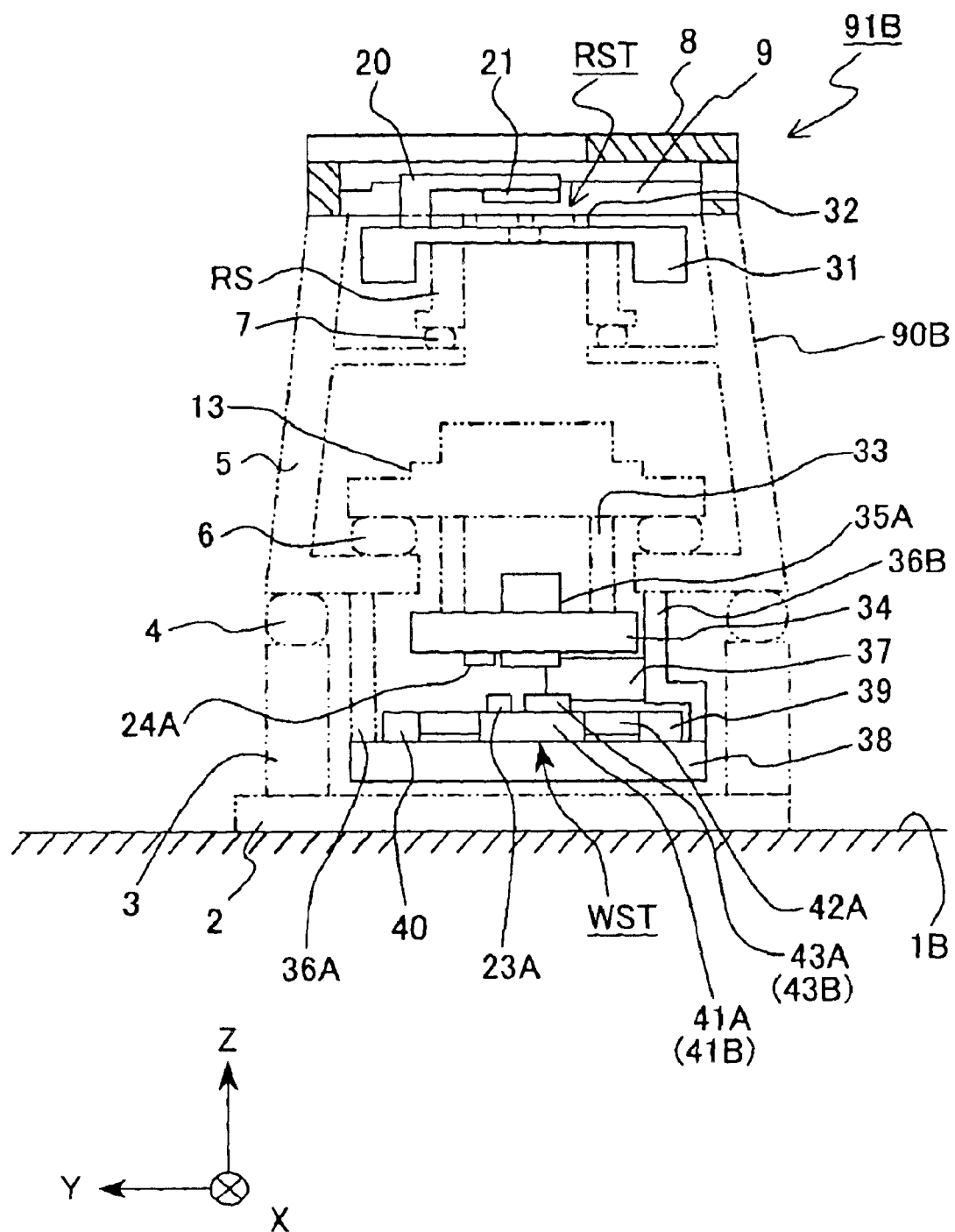
FIG. 7 shows a diagram depicting the stage module 91B of the projection exposure apparatus during manufacturing in the first manufacturing line, where a part is cut away.

FIG. 7 shows the stage module 91B of this example, and in FIG. 7, the stage module 91B, indicated by a continuous line, is comprised of a double holder type reticle stage system RST, a reticle chamber 8 which houses the reticle stage system RST, a double stage type wafer stage system WST (including a laser interferometer), a prealignment device 37, one side of the wafer stage suspension section 36B, and a sensor module. The sensor module is further comprised of a sensor column 34 supported by the sub-column 33, the light receiving section 24A secured to the sensor column 34, an alignment sensor 35A, and an auto focus sensor, which is not illustrated.

To assemble and adjust this stage module, adjustment is performed first so that the top face of the reticle base 31 (guide face of the reticle stage 32), the contact face of the sensor column 34 with the sub-column 33 and the top faces of the wafer stages 41A and 41B reach a predetermined height respectively. If necessary, the positions of these faces are readjusted based on the measured values with the main body module where this stage module 91B is actually installed. If the fixed field stop 21 is adjusted, it is preferable to actually irradiate the exposure light, but a compact and small output solid laser (e.g. harmonic generator of a YAG laser), which generates illumination light having the same wave length region as the exposure light source 1 in FIG. 1, for example, may be used as the laser for adjustment.

Figure 8:
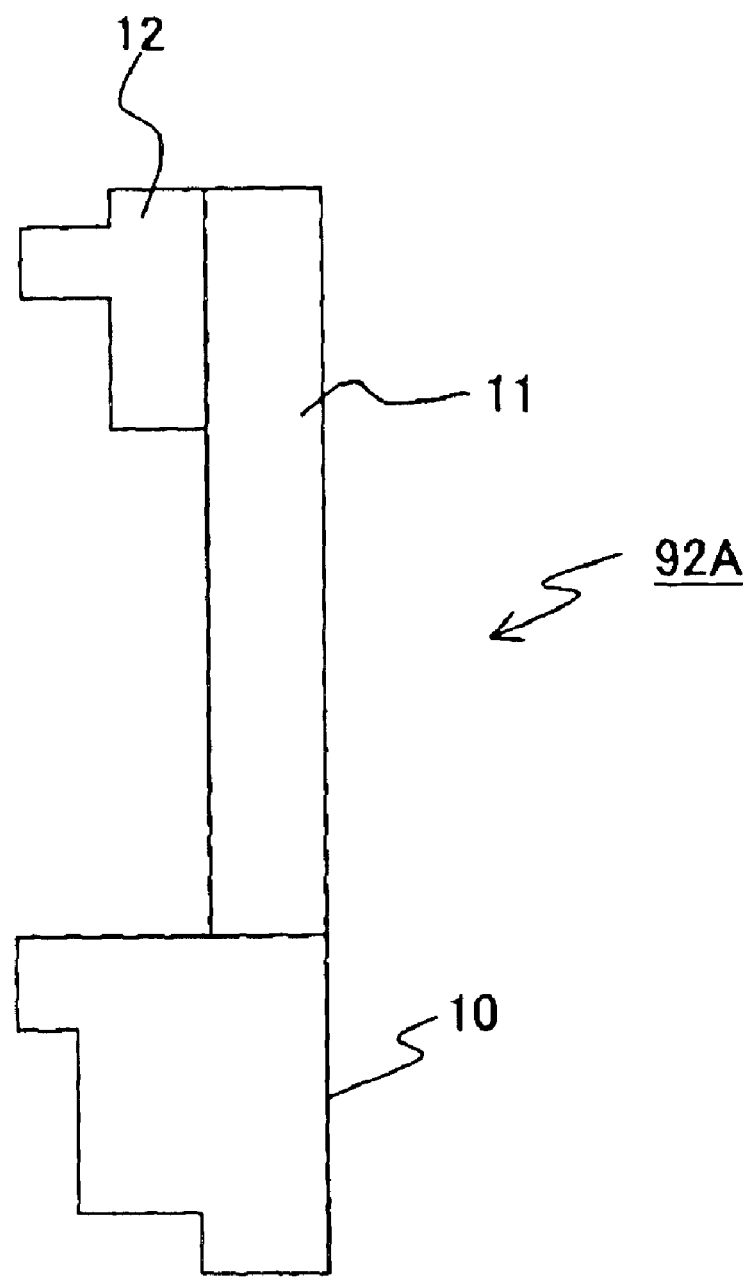
FIG. 8 shows a diagram depicting the loader module 92A in FIG. 1.

FIG. 8 shows the loader module 92A of this example, and in FIG. 8, the loader module 92A is comprised of a wafer loader system 10, a reticle loader system 11 installed thereon, and a reticle replacement section 12. The wafer loader system 10 has a sensor for detecting the positional relationship with the frame caster 2 in the main body module in FIG. 1, and by automatically adjusting the wafer transfer position based on the positional relationship detected by this sensor, it is unnecessary to adjust the position of the loader module 92A once the loader module 92A is installed to the main body module.

Now the manufacturing steps of the projection exposure apparatus with the above mentioned module configuration will be described with reference to the flow charts in FIGS. 9A and 9B. In this example, the projection exposure apparatus is manufactured while transferring a module as a part of the mechanism section between the first manufacturing line and the second manufacturing line in parallel. Manufacturing line refers to that area where the projection exposure apparatus is assembled and adjusted in a clean room, and the clean room where the first manufacturing line of this example is installed (called "clean room A") is different from the clean room where the second manufacturing line is installed (called "clean room B"). The first manufacturing line and the second manufacturing line may be installed in parallel within the same clean room.

Initially the manufacturing steps in the first manufacturing line will be described, and in Step 101 in FIG. 9A, the main body module 90A of the projection exposure apparatus is assembled on floor 1A of the clean room A, as indicated by the continuous line in FIG. 3. Then in Step 102, the sub-chamber 17, where the first illumination system IL1 is housed, is installed to the frame caster 2 of the main body module 90A via the illumination system support section 22, the sub-chamber 15, where the second illumination system IL2 is housed, is installed to the illumination system support section 14, and the exposure light source 16 is installed corresponding to the first illumination system IL1 so as to assemble the illumination system (illumination module).

Then in Step 103, the tool reticle stage system RSTB is mounted as an adjustment stage on the reticle support section RS as indicated by the two-dot chain line. At this time, the sub-chamber 15 (second illumination system IL2) is retracted to position P1 with respect to the illumination system support section 14 so that the tool reticle stage system can be easily mounted, and the sub-chamber 15 (second illumination system IL2) is returned to the position at exposure after the tool reticle stage system is mounted. The tool reticle stage system RSTB of this example is comprised of a reticle base 31 in the reticle stage system RST of the actual product in FIG. 1, and a reticle stage 32. Also a measuring device, which is not illustrated, for measuring the illumination distribution of the illumination area by the illumination system and the distribution of coherence factors (σ value), is installed to the reticle stage 32, and the illumination system is adjusted so that the illuminance unevenness and the dispersion of coherence factors measured by this measuring device come within tolerance.

The projection optical system PL is assembled and adjusted in Step 104 in parallel with the steps thus far, as described with reference to FIG. 4. In Step 105, the projection optical system PL is mounted on the main body module 90A for which the illumination system has been installed and adjusted. For this, the sub-column 25 removed from the main body module 90A in FIG. 3 is installed to the projection optical system PL for which assembly and adjustment are completed, and this projection optical system PL and the sub-column 25 are mounted on the projection system column 13. The state where the projection optical system PL is mounted is indicated by the continuous line in FIG. 6.

Figure 6:
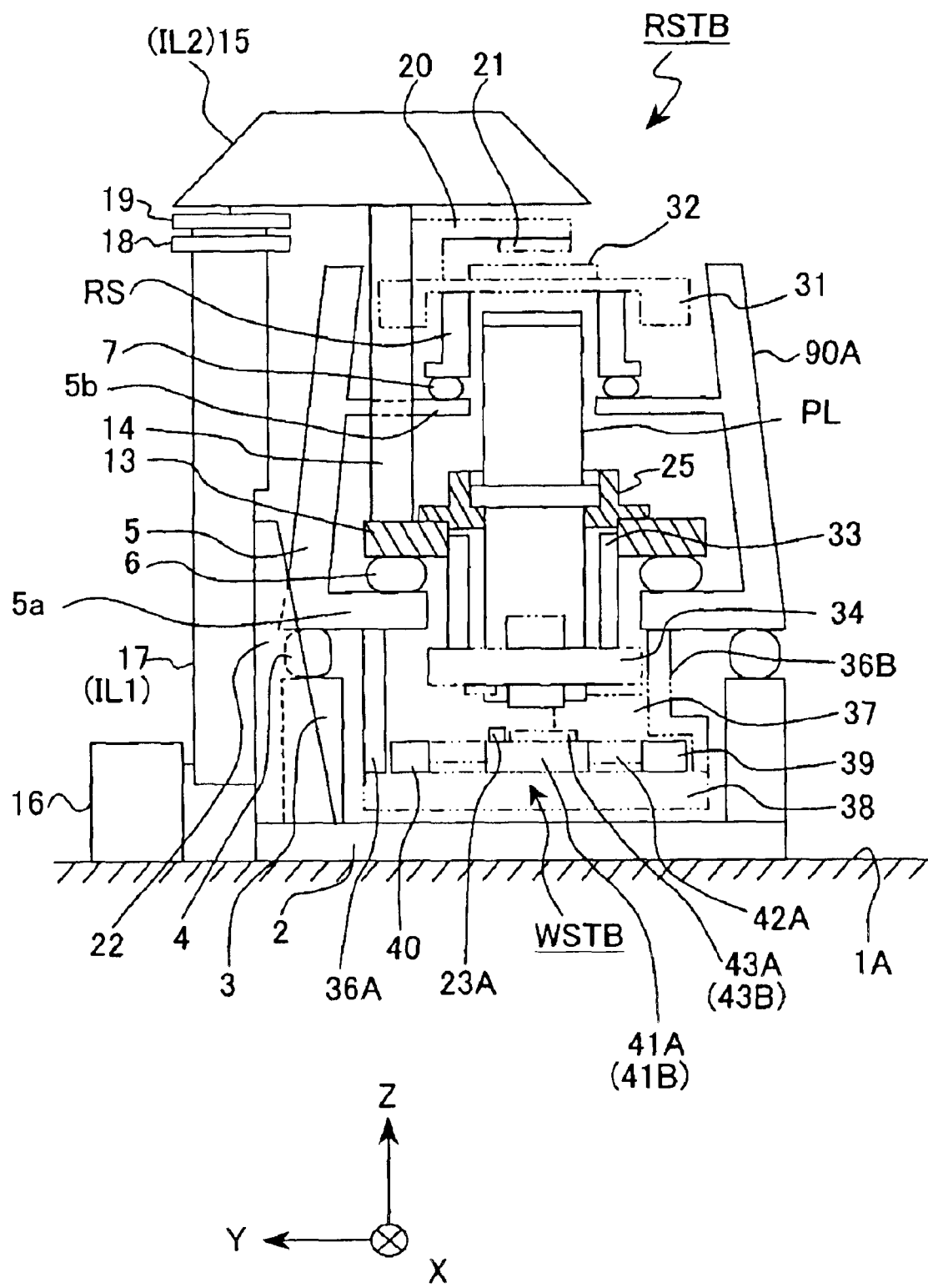
FIG. 6 shows a diagram depicting the main body module 90A, illumination system, and projection optical system PL of the projection exposure apparatus during manufacturing in the first manufacturing line, where a part is cut away.

Then in Step 106, the fixed field stop 21 is installed to the tool reticle stage system RSTB in FIG. 6 via the reticle alignment section 20, and the tool wafer stage system WSTB is mounted on the bottom face of the main body column 5 as the adjustment stage, as indicated by the two-dot chain line. The tool wafer stage system WSTB of this example roughly has the same structure as the wafer stage WST of the actual product in FIG. 1. The sensor column 34 for adjustment is also installed for the sub-column 33. In this state, the distortion and resolution of the projection optical system PL are adjusted while a test print is executed.

Then in Step 107, the tool reticle stage system RSTB and the tool wafer stage system WSTB are removed from the main body module 90A in FIG. 6. And the stage module, for which assembly and adjustment completed (described in detail later) in the above mentioned second manufacturing line, that is, the stage module 91B indicated by the continuous line in FIG. 7, is mounted on the main body module 90A in FIG. 6. At this time, the sub-chamber 15 (second illumination system IL2) is retracted to a position on the illumination system support section 14 where attachment/removal of the wafer stage system is not interfered with if necessary, so attachment/removal can be executed in an extremely short time. Parallel with this, the loader module 92A shown in FIG. 8, for which assembly and adjustment completed, is also installed to the main body module 90A. Then wiring and air tight processing for the air tight chamber are performed to complete the projection exposure apparatus, which is the same as the projection exposure apparatus in FIG. 1. Then in Step 108, the completed projection exposure apparatus is unloaded from clean room A as product A.

Then in Step 109, the main body module 90A in FIG. 3 is assembled again in clean room A. And in Step 110, the stage module, which is comprised of the reticle stage system RST in FIG. 1, the sensor column 34, various sensors to be installed thereto (sensor column unit), and the wafer stage system WST, is assembled and adjusted using the main body module 90A as an adjustment jig. This stage module is removed in the next Step 111, and is mounted to the main body module in the second manufacturing line, as mentioned later. The main body module 90A, from which the stage module is removed, shifts to Step 102, where the illumination system is assembled, Steps 103–108 are repeated, and the next product is completed and unloaded.

Now the manufacturing steps in the second manufacturing line will be described, and in Step 121 in FIG. 9B, the main body module 90B of the projection exposure apparatus is assembled on floor 1B of clean room B, as indicated by the two-dot chain line in FIG. 7. Then in Step 122, the reticle stage system RST is assembled and adjusted, as indicated by the continuous line in FIG. 7, using the main body module 90B as an adjustment jig. Then in Step 123, the sensor column 34 is installed to the sub-column 33 of the main body module 90A, and the sensor column unit is assembled and adjusted by mounting the light receiving section 24A, the alignment sensor 35A, and the laser interferometer (not illustrated) and other on the sensor column 34. And in Step 124, the wafer stage system WST is assembled and adjusted so as to be suspended from the main body column 5 via the wafer stage suspension section 36A of the main body module 90A and the newly installed wafer stage suspension section 36B. By this, the stage module 91B completes. Then in step 125, the assembled and adjusted stage module 91B is removed from the main body module 90B in FIG. 7. The removed stage module 91B is mounted to the main body module 90A in FIG. 6 in Step 107 in the first manufacturing line, as described above.

Figure 9A:
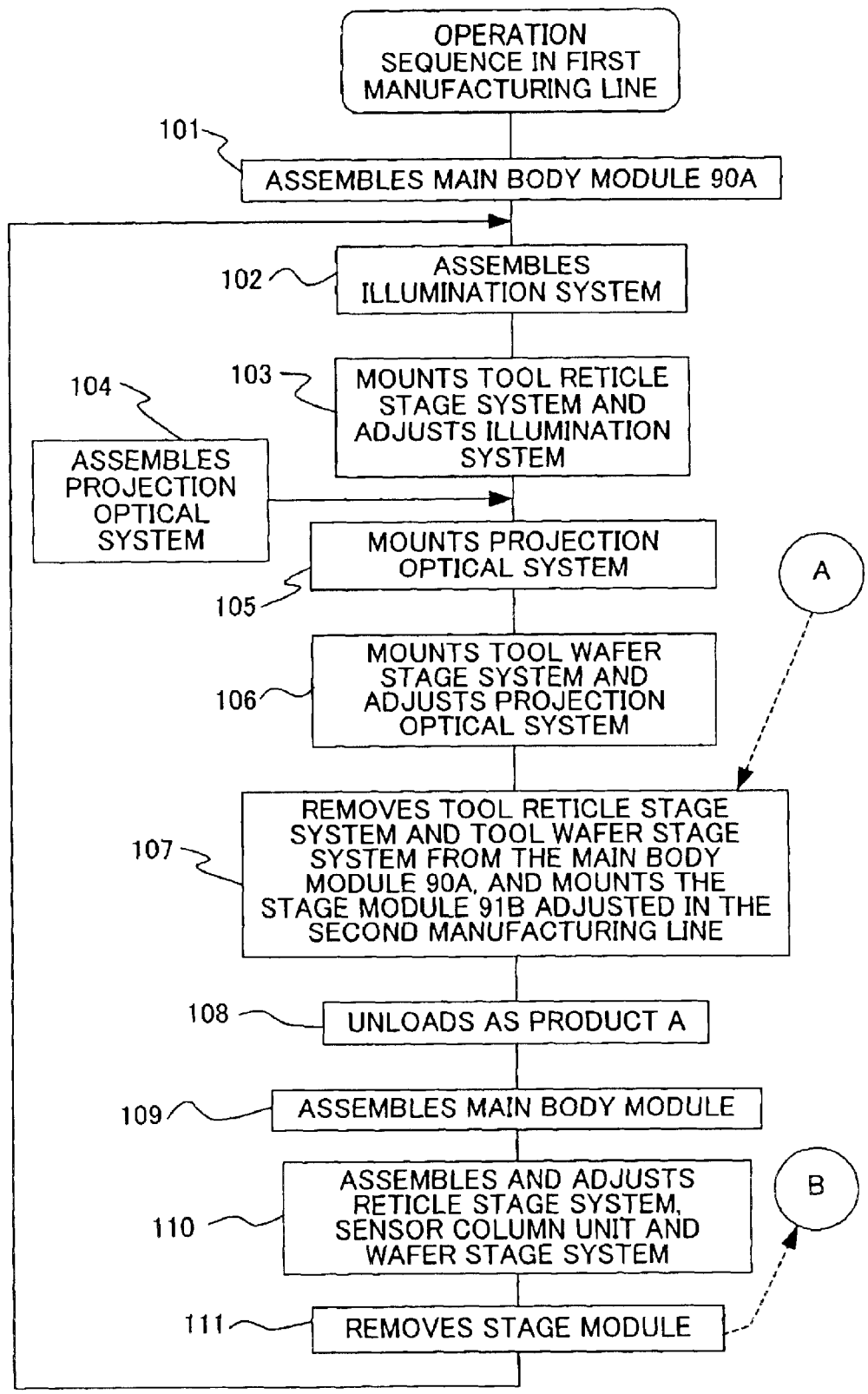
FIGS. 9A and 9B show flow charts depicting an example of the manufacturing sequence of the projection exposure apparatus of the embodiment.
Figure 9B:
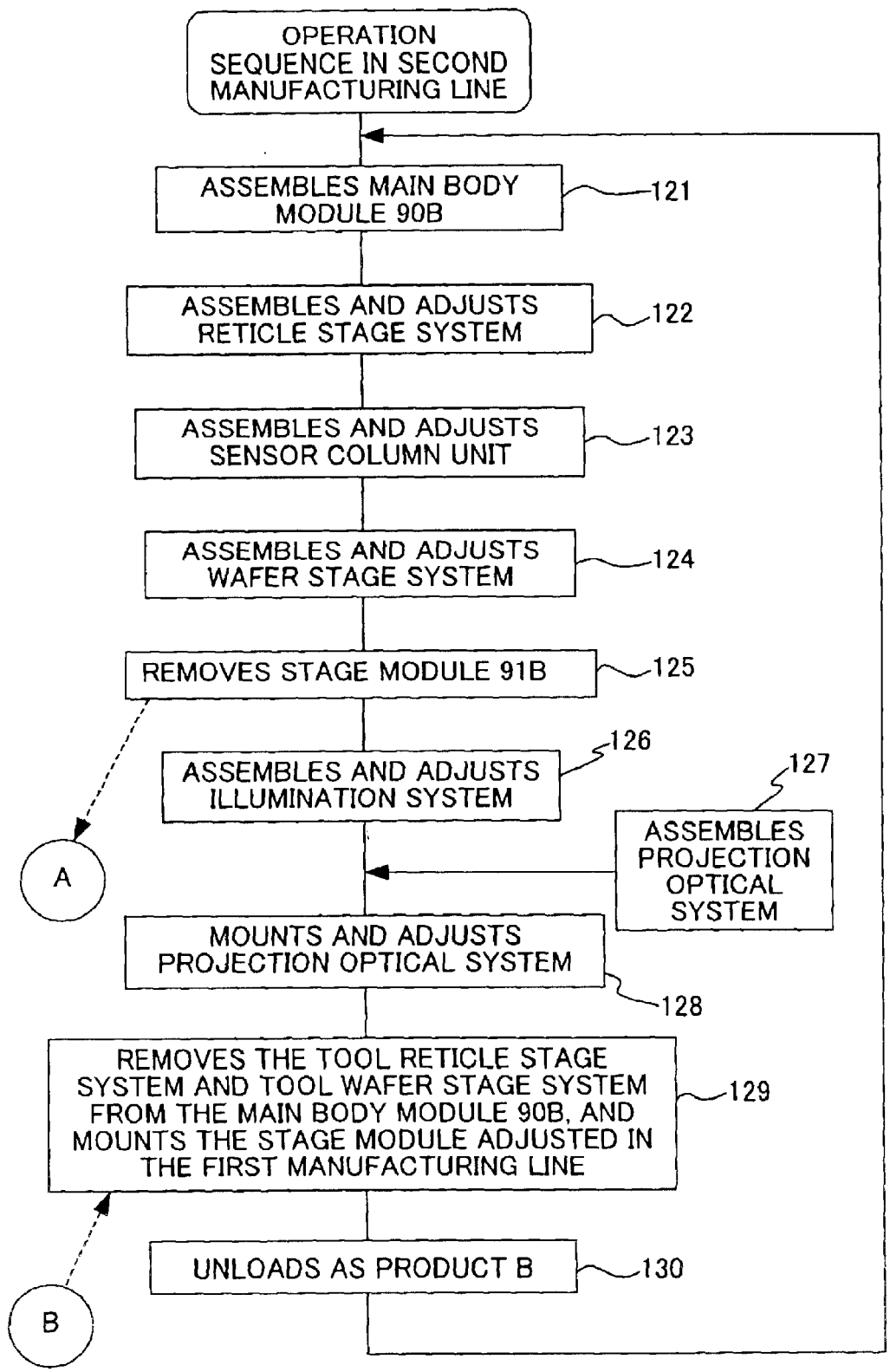

In Step 125, the tool reticle stage RSTB, which was removed in Step 107 of FIG. 9A, is installed to the main body module 90B where the stage module 91B was removed. In Step 126, the illumination system is assembled and adjusted using the tool reticle stage system, in the same way as in Steps 102 and 103. Parallel to this, the projection optical system PL is assembled and adjusted in Step 127, and in Step 128, the tool wafer stage system WSTB, removed in Step 107 of FIG. 9A, is installed to the main body module 90B. And in the same way as in Steps 105 and 106 of FIG. 9A, the projection optical system PL is mounted on the main body module 90B and is adjusted using the tool wafer stage system.

Then in Step 129, the tool reticle stage system and the tool wafer stage system are removed from the main body module 90B in FIG. 7, and the stage module, which has been assembled and adjusted in Step 110 in the above mentioned first manufacturing line, is mounted on the main body module 90B, and wiring and air tight processing for a plurality of air tight chambers are executed so as to complete the projection exposure apparatus, which is the same as the projection exposure apparatus in FIG. 1. Then in Step 130, the completed projection exposure apparatus is unloaded from clean room B as product B. Then Steps 121–130 are repeated and the next product is completed and unloaded. The repeat of these Steps 121–130 is the same as the sequence of the repeat of the Step 101–111 in the first line. In other words, in the first line and the second line, the same sequence is executed at shifted-time. This time-shifting is controlled so that the assembly and adjustment of the wafer stage system in Step 124 of the second line is completed by the time the stage system is installed in Step 107 of the first line.

The manufacturing method of this example can be applied when two or more exposure apparatuses of a same model are manufactured, so this method is applicable to cases of manufacturing most ordinary exposure apparatuses. According to this example, the stage module 91B to be mounted on the main body module 90A in the first manufacturing line is assembled and adjusted using another main body module 90B as an adjustment jig in the second manufacturing line, so it is unnecessary to provide a dedicated adjustment jig for the stage module 91B, which decreases the required area of the projection exposure apparatus in a manufacturing factory and decreases manufacturing cost. Especially when the stage module 91B has a double holder type or a double stage type large stage system, as in this example, and requires that a dedicated adjustment jig be provided, an adjustment jig larger than the stage system is required, so the effect of such a method as in this example, where the main body module 90B, which is part of the product, is used as an adjustment jig.

Also in this example, the main body module 90B, which is initially used as an adjustment jig for the stage module 91B, becomes the final product, so there is no waste.

In the projection exposure apparatus of this example, the wafer stage system WST is supported by being suspended from the bottom face of the main body column 5. The reticle stage RST is supported to be roughly symmetrical with the wafer stage system WST in the vertical direction, and the projection optical system PL is supported by the main body column 5 via the active vibration proof stand 6, so vibration during a scanning exposure is hardly transferred to other elements, and the influence of vibration can be decreased considerably. Also with such a structure, the attachment/removal of the reticle stage system RST and the wafer stage system WST is easier than a conventional stacked up system structure, so it is easy to use a tool reticle stage system and a tool wafer stage system for adjusting a predetermined module, as in the case of this example, and to use a stage module which has been assembled and adjusted using another main body module.

Two manufacturing lines are established in the above embodiment, but a third manufacturing line (e.g. installed in a third clean room) may be provided so that the stage module assembly operation in Steps 109–111 in FIG. 9 are executed in the third manufacturing line. Or it is possible to establish a third manufacturing line having steps similar to the first and second lines in FIG. 9, and have a sequence to start assembly steps (corresponding to Step 109 and Step 121) of the main body module (90C) at a time which is later than the second line. In this case, the stage module removed in Step 111 in the first line can be mounted on the main body module in the third line in the steps for removing the tool stage in the third line (corresponding to Step 107 and Step 129). And the flow of the stage module can be changed so that the stage module removed in the stage module removal steps in the third line (corresponding to Step 111 and Step 125) is mounted on the main body module 90B in the second line in Step 129 in the second line. In the same way, four or more manufacturing lines may be established where each line has steps with the same sequence, operating such that the operation start time of a predetermined step delays slightly between lines, so that an assembled stage module is transferred to a line with a later start time. In this case, the line which started a predetermined step the latest can transfer the stage module to a line which started the step the earliest. In other words, the manufacturing method of this invention can be executed by operating a plurality of lines having sequences with the same repeat steps with steps at start times which are shifted for a predetermined time. In the projection exposure apparatus in FIG. 1, the sub-chamber 15, where the second illumination system IL2 is housed, is supported by the illumination system support section 14 on the projection system column 13, but in this example, the fixed field stop 21 is installed to the reticle base 31, so the second illumination system IL2 and the sub-chamber 15 may be supported by the illumination support section 22, which supports the first illumination system IL1 (sub-chamber 17) on the frame caster 2, for example.

In the projection exposure apparatus in FIG. 1, the reticle support section RS is supported by the sub-column 5*b* of the main body column 5 via the vibration proof member 7, and the reticle stage system RST is supported by this reticle support section RS. Another possible configuration is where the reticle support section RS is secured to the sub-column 25 which supports the projection optical system PL, and the reticle stage system RST is supported by the reticle support section RS.

Another example of the embodiment of the present invention will now be described with reference to FIG. 10–FIGS. 12A to 12C. In this example, a more simplified stage system is used as the tool reticle stage system and the tool wafer stage system, which are used in Step 103 and Step 106 in FIG. 9 respectively, and in FIG. 10, the parts corresponding to FIG. 1 and FIG. 3 are denoted with the same numbers, for which description is omitted.

Figure 10:
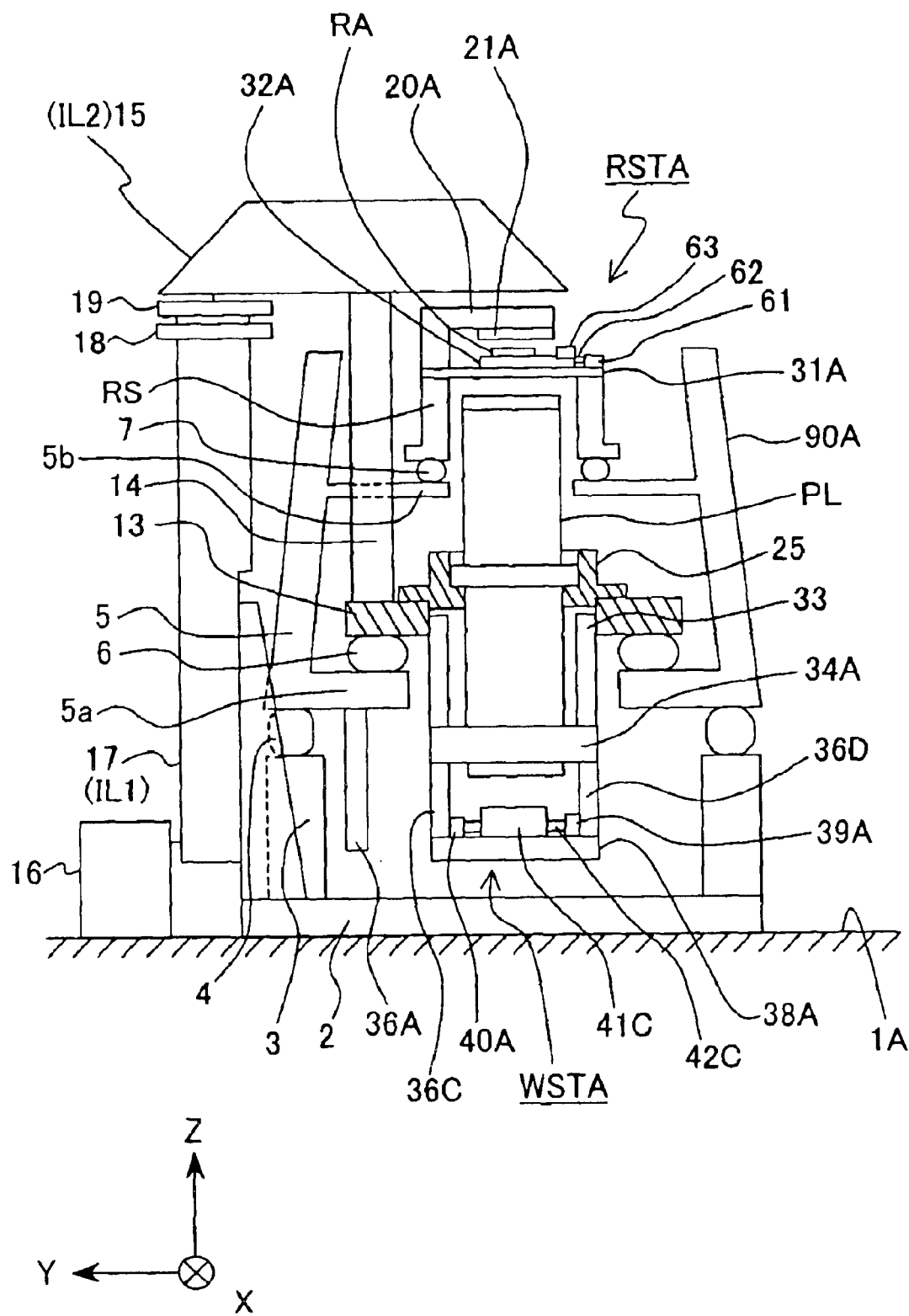
FIG. 10 shows a diagram depicting a state when the tool reticle stage system RSTA and the tool wafer stage system WSTA are mounted on the main body module 90A of the projection exposure apparatus in another embodiment example of the present invention, where a part is cut away.

FIG. 10 shows the state where the illumination system, projection optical system PL, tool reticle stage system RSTA and tool wafer stage system WSTA are mounted on the main body module 90A in the steps of manufacturing the projection exposure apparatus of this example on floor 1A of the first manufacturing line, and in FIG. 10, the tool reticle stage system RSTA, which is the first adjustment stage, is comprised of a base member 31A which is placed on the reticle support section RS, a movable stage 32A which is placed on the base member 31A so as to freely move two-dimensionally, the linear motor or stepping motor type driving device 61 for driving this movable stage 32A in the X direction and the Y direction, an illumination system measuring device 63 which is secured to the movable stage 32A, a dummy reticle RA which is placed on the movable stage 32A, the support section 20A which is secured on the base member 31A, and the fixed field stop 21A which is secured to the support section 20A. The base member 31A of this example is smaller than the reticle base 31 in FIG. 1, and while the reticle stage system RST is a double holder type, the tool reticle stage system RSTA is a single holder type single stage, so the tool reticle stage system RSTA as a whole is much smaller and lighter than the reticle stage system RST. The illumination system measuring device 63 of this example can measure the unevenness of the illuminance distribution of the illumination system, the dispersion of the coherence factors, and telecentricity.

In FIG. 10, the tool wafer stage system WSTA, which is the second adjustment stage, is comprised of a column 34A which is supported by a sub-column 33 of the main body module 90A, a base member 38A which is supported by being suspended from this column 34A via the suspension sections 36C and 36D, a movable stage 41C which is placed on the base member 38A so as to freely move two-dimensionally, and on where the wafer is placed on the top face, X axis linear guides 39A and 40A for driving this movable stage 41C in the X direction, Y axis slider 42C for driving the movable stage 41C in the Y direction, and such a driving device as a linear motor, which is not illustrated. In this case, the base member 38A is much smaller than the wafer base 38 in FIG. 1, and the moving range of the movable stage 41C is set to be much smaller compared with the wafer stages 41A and 41B in FIG. 1. Also, while the wafer stage system WST is a double stage type, the tool wafer stage system WSTA is a single holder type single stage, so the tool wafer stage system WSTA as a whole is much smaller and lighter than the wafer stage system WST.

Figure 11A:
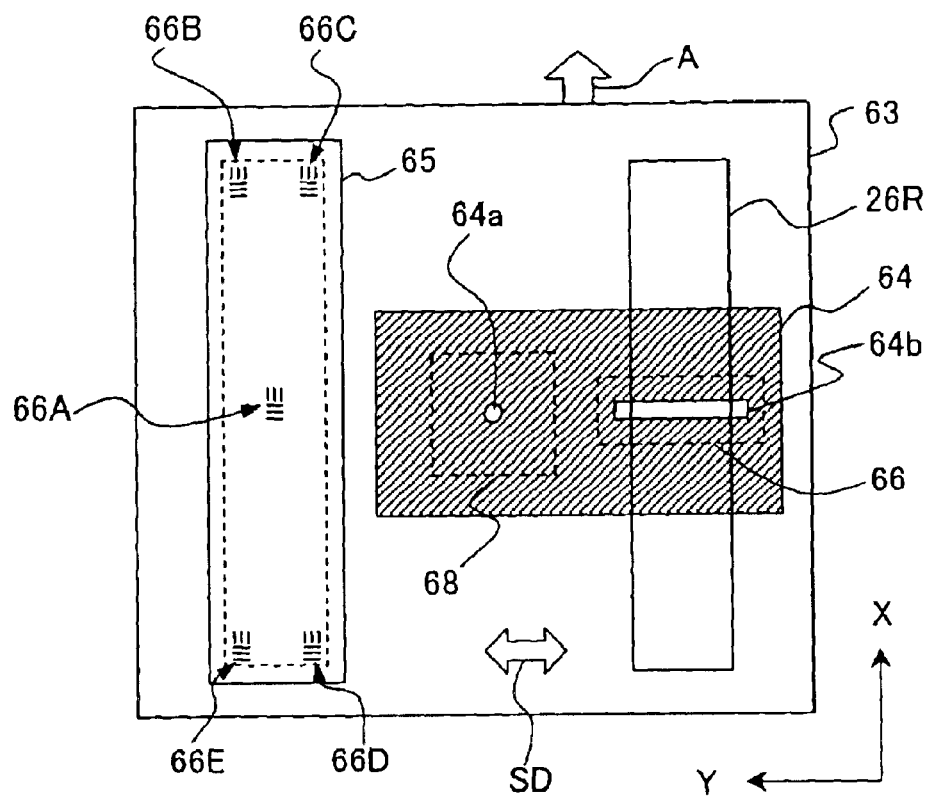
FIG. 11A shows a plan view depicting an example of the illumination system measuring device 63 in FIG. 10.
Figure 11B:
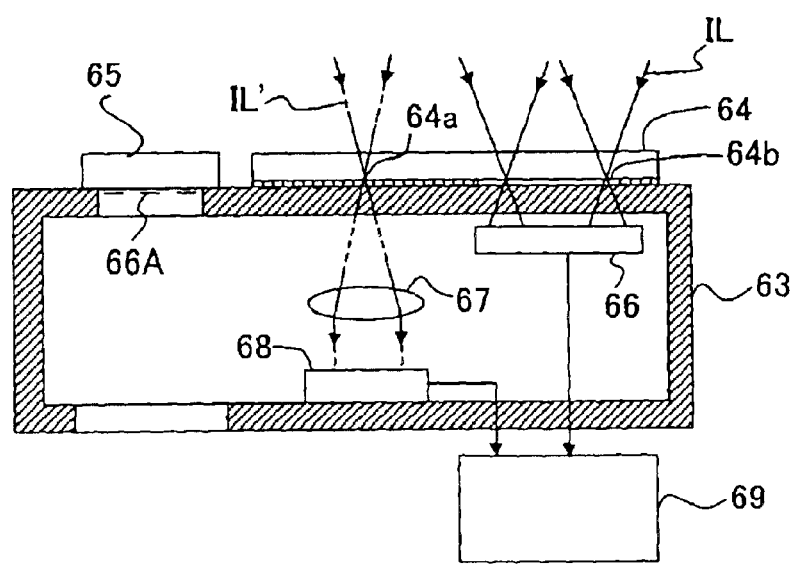
FIG. 11B shows a cross-sectional view of FIG. 11A viewed from the front face.

A configuration example of the illumination measuring device 63 in FIG. 10 will now be described. FIG. 11A is a plan view depicting an example of the illumination system measuring device 63, FIG. 11B is a cross-sectional view thereof when viewed from the front face, and as FIG. 11A and FIG. 11B show, a glass substrate 64, which transmits the exposure light, is installed so as to cover the opening of the top face of the box-shaped main body section of the illumination system measuring device 63, and a pin hole 64a and a slit 64b, elongated in the scanning direction SD (Y direction), are formed on the bottom face of the glass substrate 64 with a light shielding film as a background. The length of the slit 64b is set to be longer than the illumination area 26R of the exposure light, and a photo-electric detector 66 for receiving exposure light which passes through the slit 64b is disposed on the bottom face of the slit 64b. A condensing lens 67 is disposed on the bottom face of the pin hole 64a, the light receiving face of a two-dimensional image pickup device 68, such as a CCD, is disposed on the optical Fourier transform face (pupil face) by the condensing lens 67, and the detection signals of the image pickup device 68 and the photo-electric detector 66 are supplied to the signal processing unit 69.

A reference plate 65 for transmitting the exposure light, where a plurality of two-dimensional patterns 66A–66E for characteristics evaluation are formed, is installed in an area which size is roughly the same as the illumination area 26R, so as to cover the opening adjacent to the glass substrate 64 on the top face of the main body section of the illumination system measuring device 63, and the bottom face of the reference plate 65 has an opening so that the exposure light transmits through. The images of the patterns 66A–66E for characteristics evaluation of this reference plate 65 are projected to the wafer stage system side via the projection optical system PL, and the positions of the images are measured so as to evaluate the distortion and magnification errors of the projection optical system PL.

When the illuminance unevenness of the illumination area 26R in a non-scanning direction (X direction) is measured using the illumination system measuring device 63 in FIG. 11, the illumination system measuring device 63 is aligned so that the slit 64b covers the illumination area 26R of the exposure light in the Y direction, then the illumination system measuring device 63 is moved in the X direction (non-scanning direction), as indicated by arrow mark A, using the driving device 61, and the detection signals of the photo-electric detector 66 are monitored. With this method, the illuminance unevenness in the illumination area 26R in the scanning direction cannot be measured, and is not measured here since the illuminance unevenness in the scanning direction can be equalized by the integrating effect in the case of the scanning exposure system.

When the dispersion of the coherence factors ($\sigma$ value) in the illumination area 26R is measured, on the other hand, the illumination system measuring device 63 is driven such that the illumination area 26R is scanned in the X direction and the Y direction with the pin hole 64a, and the center point (center of gravity point of quantity of light) of the incident light on the image pickup device 68 for each measurement point and the size of the spread of the incident light thereof are monitored. At this time, the size of the spread of the incident light corresponds to the $\sigma$ value at each measurement point. Since the center point of the incident light corresponds to the incident angle of the incident light, the telecentricity of the illumination system can also be measured by monitoring the center point of the incident light at each measurement point. The illuminance unevenness in the scanning direction can also be measured by the integration value of the quantity of light.

Figure 12A:
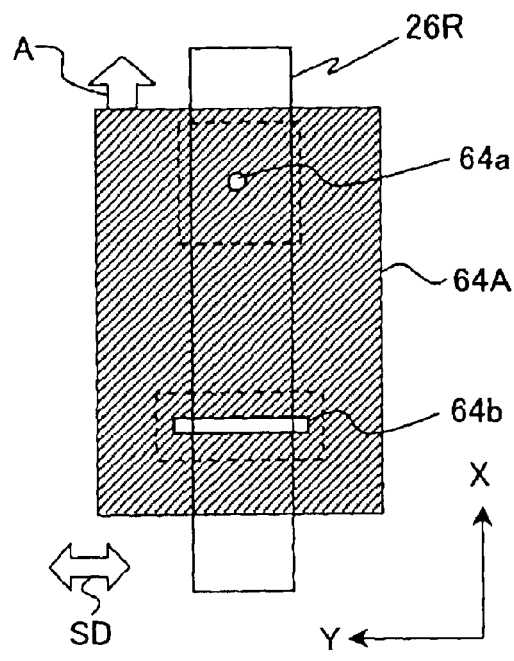
FIG. 12A shows a plan view depicting key sections of another example of the illumination system measuring device 63 in FIG. 10.
Figure 12B:
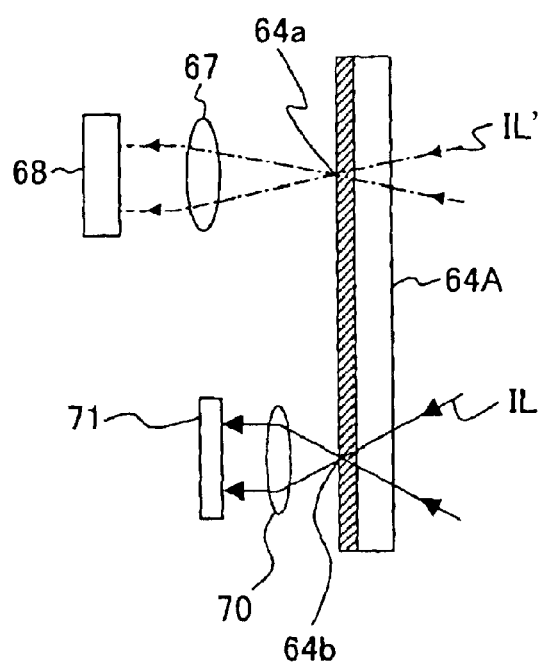
FIG. 12B shows a side view of FIG. 12A.
Figure 12C:
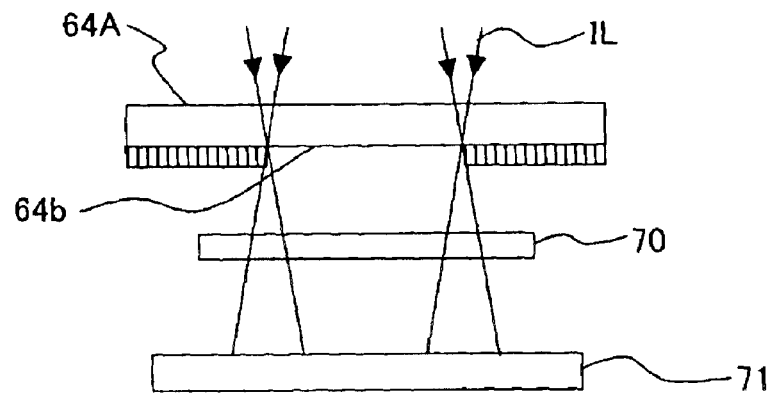
FIG. 12C shows a front view of FIG. 12A.

The configuration shown in FIGS. 12A to 12C can also be used for the illumination system measuring device 63. FIG. 12A is a plan view depicting the glass substrate 64A, which is a key section of another example of the illumination system measuring device 63, FIG. 12B is a side view thereof, FIG. 12C is a front view thereof, and as FIG. 12A–FIG. 12C show, the pin hole 64a and the slit 64b, which is elongated in the scanning direction SD (Y direction), are formed in a line along the non-scanning direction on the bottom face of the glass substrate 64A with the light shielding film as a background. The condensing lens 67 and the two-dimensional image pickup device 68 (light receiving face locates on the pupil face) are disposed on the bottom face of the pin hole 64a, a cylindrical lens 70, having refracting power in the X direction, is disposed on the bottom face of the slit 64b, and the light receiving face of the two-dimensional image pickup device 71, such as a CCD, is disposed on the optical Fourier transform face (pupil face) of this cylindrical lens 70.

In this example, as FIG. 12A shows, the glass substrate 64A and the detection system are moved in the non-scanning direction (X direction) as indicated by arrow mark A so as to cover the illumination area 26R with the slit 64b, and the dispersion of the width of the light quantity distribution of the incident light to the image pickup device 71 in the X direction at each measurement point is monitored, so that the unevenness of the coherence factors in the non-scanning direction in the illumination area 26R can be measured. Since the width of the illumination area 26R in the scanning direction is narrow and the dispersion of the coherence factors in the scanning direction in the illumination area 26R is small, the dispersion of the coherence factors in the scanning direction is not measured in this example.

Then the glass substrate 64A and the detection system are shifted in the non-scanning direction in a state where the pin hole 64a is set at the center of the illumination area 26R in the scanning direction, and the center positions in the X direction and the Y direction of the light quantity distribution of the incident light to the image pickup device 68 are monitored at each measurement point, so that the telecentricity in the illumination area 26R can be accurately measured. Aberration adjustment may be executed by measuring the wave front aberration of the illumination optical system (first and second illumination systems IL1 and IL2) described above.

When the semiconductor device is manufactured on a wafer using the projection exposure apparatus of the above embodiment, this semiconductor device is manufactured through the step of designing functions and the performance of the device, the step of manufacturing the reticle based on this step, the step of manufacturing a wafer from silicon material, the step of aligning the wafer by the projection exposure apparatus of the above mentioned embodiment, and exposing reticle patterns on the wafer, the step of assembling the device (including dicing step, bonding step and packaging step), and the inspection step.

Application of the exposure apparatus of the present invention is not limited to the exposure apparatuses for manufacturing semiconductor devices, but can be applied widely to exposure apparatuses for liquid crystal display devices fabricated on a square glass plate, exposure apparatuses for such display devices as plasma displays, and exposure apparatuses for manufacturing such various devices as image pickup devices (e.g. CCD), micromachines, thin film magnetic heads or DNA chips. Also the present invention can be applied to the exposure steps (exposure apparatuses) when masks, where mask patterns of various devices are formed, (e.g. photo masks, reticles) are manufactured using photolithographic steps.

The present invention can be applied not only to scanning exposure type projection exposure apparatuses, such as step and scan systems, but also to step and repeat type systems (full field exposure type) projection exposure apparatuses, and proximity type exposure apparatuses which do not use projection optical systems.

In this case, if a linear motor is used for the wafer stage system or the reticle stage system, the movable stage may be held by an air levitation type using an air bearing or by a magnetic levitation type system.

The movable stage may be the type which moves along guides, or may be a guideless type which uses no guides. A reaction force which is generated when the wafer stage or reticle stage is moving in steps or is accelerating/decelerating at scanning exposure may be mechanically released to the floor (ground) using a frame member, as disclosed in (USP) U.S. Pat. No. 5,528,118 or (USP) U.S. Pat. No. 6,020,710 (corresponding to Japanese Patent Application Laid-Open No. 8-33022). The contents of the US patents are incorporated herein by reference. The configuration of the twin stage presented as an example of an embodiment of the present invention is disclosed in detail, for example, in PCT International Publication No. WO 98/24115 (corresponding to U.S. patent application Ser. No. 09/714,943) and U.S. Pat. No. 6,262,796, and the stage configuration and the stage operation control disclosed in this document can be applied to the present invention. The contents of PCT International Publication No. WO98/24115 (corresponding to U.S. patent application Ser. No. 09/714, 943) and U.S. Pat. No. 6,262,796 are incorporated herein by reference. As Japanese Patent Application Laid-Open No. 8-06323 (corresponding to U.S. Pat. No. 6,323,935) discloses, a reticle stage system to which the law of the conservation of momentum is applied, where the counter mass moves as the reticle stage moves, may be used, and the content of this US Patent is incorporated herein by reference. In the above embodiment, the wafer base 38 is suspended from the sub-column 5a of the main body column 5 via the suspension sections 36A and 36B, but the wafer base 36 may be supported by an active vibration proof stand installed to the frame caster 2. As described above, the configuration of each module in the above embodiment may be arbitrary. In the above embodiment, the manufacturing steps for exposure apparatuses were described, but the products to which the manufacturing method of the present invention can be applied are not limited to exposure apparatuses, but may be lithographic systems other than exposure apparatuses.

The present invention is not limited to the above mentioned embodiments, but can have various configurations within the subject matter of the present invention. The manufacturing method of the present invention is not limited to the manufacturing process of exposure apparatuses, but can be applied to the manufacture of arbitrary industrial products, for which steps for manufacturing modules and final products using the modules on a line are executed using a plurality of lines, for example, to manufacture various manufacturing devices, inspection devices, home electronic products and transport equipment related to manufacturing semiconductors.

The manufacturing method of the present invention can decrease cost and improve mass productivity of the manufacturing process where the modules and parts are transferred to a line at a suitable timing. According to the present invention, where a mechanism section assembled in another manufacturing line is used, exposure apparatuses can be manufactured efficiently without using a dedicated large adjustment jig. If the stage for the second object is supported by being suspended to decrease the influence of vibration, the attachment/removal of the stage for the first object and the second object become relatively easy, so the manufacturing method of the present invention can be easily applied and exposure apparatuses can be manufactured efficiently.

According to the manufacturing method for devices of the present invention, high functioning devices can be mass produced at low manufacturing cost.

What is claimed is:

1. A manufacturing method for exposure apparatuses which expose a second object by an exposure beam via a first object and a projection system, comprising:

a first step of assembling a first main body frame of an exposure apparatus in a first manufacturing line;

a second step of assembling a second main body frame of an exposure apparatus in a second manufacturing line;

a third step of installing a first adjustment stage in the first main body frame at a position where a stage which moves the first object is placed in the first manufacturing line, and assembling and adjusting an illumination system to be mounted on the first main body frame;

a fourth step of assembling and adjusting a stage system which aligns the first object and the second object using the second main body frame in the second manufacturing line; and a fifth step of removing the first adjustment stage from the first main body frame in the first manufacturing line, mounting the projection system and the stage system removed from the second main body frame on the first main body frame to assemble a first exposure apparatus.

2. The manufacturing method for exposure apparatuses according to claim 1, wherein a second exposure apparatus is assembled and adjusted using the second main body frame in the second manufacturing line after the fifth step.

3. The manufacturing method for exposure apparatuses, according to claim 1, wherein the fifth step further comprises:
a first sub-step for mounting the projection system on the first main body frame;
a second sub-step for mounting a second adjustment stage on the first main body frame at a position where a stage which moves the second object is placed, in order to adjust the projection system;
a third sub-step for removing the first and second adjustment stages from the first main body frame; and
a fourth sub-step for mounting the stage system removed from the second main body frame on the first main body frame.

4. The manufacturing method for exposure apparatuses according to claim 3, further comprising a step of assembling and adjusting an illumination system to be mounted on the second main body frame to assemble a second exposure apparatus by mounting the removed first adjustment stage on the second main body frame at a position where a stage which moves the first object in the second exposure apparatus is placed in the second manufacturing line after removing the stage system from the second main body frame in the second manufacturing line.

5. The manufacturing method for exposure apparatuses according to claim 4, further comprising a step of mounting the removed second adjustment stage on the second main body frame at a position where a stage which moves the second object in the second exposure apparatus is placed in order to adjust a projection system of the second exposure apparatus in the second manufacturing line.

6. The manufacturing method for exposure apparatuses according to claim 3, wherein the stage system installed to the second main body frame is adjusted based on a positional relationship between the first main body frame and the second adjustment stage.

7. The manufacturing method for exposure apparatuses according to claim 6, wherein a partial illumination system at the first object side of the illumination system is slidably installed to the first main body frame, and the partial illumination system is retracted when the first adjustment stage is attached to/removed from the first main body frame and when the stage system is installed.

8. The manufacturing method for exposure apparatuses according to claim 1, wherein the first adjustment stage further comprises a pin hole which is movable two-dimensionally and a photo-electric detector which detects the exposure beam which passes through the pin hole. and optical information with respect to coherence factors of the illumination system is measured by the first adjustment stage.

9. The manufacturing method for exposure apparatuses according to claim 1, wherein the first exposure apparatus is a scanning type exposure apparatus which moves the first object and the second object in a predetermined scanning direction synchronously to execute exposure, the first adjustment stage comprises a pin hole which is movable in a non-scanning direction which crosses the scanning direction, and a photo-electric detector which detects the exposure beam which passes through this pin hole, and substantially two-dimensional illuminance unevenness of the exposure beam is measured using the first adjustment stage.

10. The manufacturing method for exposure apparatuses according to claim 1, wherein the first exposure apparatus is a scanning type exposure apparatus which moves the first object and the second object in a predetermined scanning direction synchronously to execute exposure, the first adjustment stage comprises a slit which can move in a non-scanning direction which crosses the scanning direction, and a photo-electric detector which detects the exposure beam which passes through this slit, and substantially two-dimensional illuminance unevenness of the exposure beam is measured using the first adjustment stage.

11. The manufacturing method for exposure apparatuses according to claim 1, wherein the stage system installed to the second main body frame is adjusted based on a positional relationship between the first main body frame and the first adjustment stage.

12. A manufacturing method for exposure apparatuses which expose a second object by an exposure beam via first object, comprising:
assembling a main body frame of a first exposure apparatus which includes a plurality of modules in a first manufacturing line;
installing an adjustment module to the main body frame of the first exposure apparatus to adjust a first module of the first exposure apparatus;
adjusting a second module, which is different from the first module and which is to be installed to the main body frame of the first exposure apparatus, by using a main body frame of a second exposure apparatus which is different from the first exposure apparatus and which is assembled in a second manufacturing line; and
installing in the first manufacturing line the adjusted second module, which has been removed from the main body frame of the second exposure apparatus, to the main body frame of the first exposure apparatus in order to assemble the first exposure apparatus.

13. The manufacturing method for exposure apparatuses according to claim 12, further comprising:
removing the adjustment module from the main body frame of the first exposure apparatus; and
installing the adjustment module to the main body frame of the second exposure apparatus from which the adjusted second module has been removed in order to adjust a module of the second exposure apparatus.

14. The manufacturing method for exposure apparatuses according to claim 12, wherein the second exposure apparatus is assembled in the second manufacturing line, and a sequence of the second manufacturing line is time-shifted from that of the first manufacturing line.

15. The manufacturing method for exposure apparatuses according to claim 12, wherein:
the second exposure apparatus including a plurality of modules is assembled in the second manufacturing line; and
the plurality of modules is adjusted in a manufacturing line different from the second manufacturing line and is transferred to the second manufacturing line.

16. The manufacturing method for exposure apparatuses according to claim 12, further comprising:
assembling and adjusting a projection system; and
mounting the projection system on the main body frame of the first exposure apparatus in the first manufacturing line,
wherein the adjusted second module is different from the projection system.

17. The manufacturing method for exposure apparatuses according to claim 16, wherein:
the first module which is adjusted in the first manufacturing line includes an illumination system; and the second module which is adjusted in the second manufacturing line includes a stage system which moves the first object and the second object.

18. A manufacturing method for exposure apparatuses which expose a second object by an exposure beam via first object, comprising:

assembling a main body frame of a first exposure apparatus in a first manufacturing line;

assembling a main body frame of a second exposure apparatus, which is different from the first exposure apparatus, in a second manufacturing line having a sequence that is time-shifted from that of the first manufacturing line;

adjusting, in the second manufacturing line, a module of the first exposure apparatus, which is to be installed to the main body frame of the first exposure apparatus, by using the assembled main body frame of the second exposure apparatus;

removing the adjusted module from the main body frame of the second exposure apparatus, and installing, in the first manufacturing line, the adjusted module to the main body frame of the first exposure apparatus in order to assemble the first exposure apparatus which has a plurality of modules including the adjusted module; and assembling the second exposure apparatus, which has a plurality of modules, in the second manufacturing line, wherein the plurality of modules of the second exposure apparatus includes a module which is adjusted in a manufacturing line different from the second manufacturing line and which is transferred to the second manufacturing line.

19. The manufacturing method for exposure apparatuses according to claim 18, further comprising assembling an illumination system into the first exposure apparatus so as to at least a part of the illumination system is mounted on the main body frame of the first exposure apparatus.

20. The manufacturing method for exposure apparatuses according to claim 19, further comprising:

assembling and adjusting a projection system; and mounting the projection system on the main body frame of the first exposure apparatus and optically adjusting the first exposure apparatus in the first manufacturing line.

21. The manufacturing method for exposure apparatuses according to claim 20, wherein the module of the first exposure apparatus, which is adjusted in the second manufacturing line, includes a stage system which moves the first object and the second object.

22. The manufacturing method for exposure apparatuses according to claim 18, further comprising:

assembling and adjusting a projection system; and mounting the projection system and at least a part of an illumination system on the main body frame of the first exposure apparatus, and optically adjusting the projection system and the illumination system, respectively, in the first manufacturing line.

23. The manufacturing method for exposure apparatuses according to claim 18, wherein the module of the second exposure apparatus that is adjusted in the manufacturing line different from the second manufacturing line has a same structure as that of the module of the first exposure apparatus that is adjusted in the second manufacturing line.

* * * * *